United States Patent
Matsumura et al.

(10) Patent No.: US 10,032,104 B2
(45) Date of Patent: Jul. 24, 2018

(54) RFID TAG

(71) Applicants: FUJITSU LIMITED, Kawasaki-shi, Kanagawa (JP); FUJITSU FRONTECH LIMITED, Inagi-shi, Tokyo (JP)

(72) Inventors: Takayoshi Matsumura, Yokohama (JP); Yoshiyasu Sugimura, Inagi (JP); Shunji Baba, Yokohama (JP); Hideo Miyazawa, Inagi (JP); Mimpei Miura, Inagi (JP)

(73) Assignees: FUJITSU LIMITED, Kawasaki (JP); FUJITSU FRONTECH LIMITED, Tokyo (JP)

( * ) Notice: Subject to any disclaimer, the term of this patent is extended or adjusted under 35 U.S.C. 154(b) by 0 days.

(21) Appl. No.: 15/608,093

(22) Filed: May 30, 2017

(65) Prior Publication Data

US 2017/0351945 A1   Dec. 7, 2017

(30) Foreign Application Priority Data

Jun. 2, 2016   (JP) ................................. 2013-111343
Nov. 2, 2016   (JP) ................................. 2016-215386

(51) Int. Cl.
  *G06K 19/02*   (2006.01)
  *G06K 19/07*   (2006.01)
  (Continued)

(52) U.S. Cl.
  CPC ....... *G06K 19/0723* (2013.01); *G06K 19/025* (2013.01); *G06K 19/027* (2013.01);
  (Continued)

(58) Field of Classification Search
  CPC ............... G06K 19/025; G06K 19/027; G06K 19/0723; G06K 19/077; G06K 19/07728
  (Continued)

(56) References Cited

U.S. PATENT DOCUMENTS

2006/0145867 A1*  7/2006  Kikuchi ............. G06K 19/0773
                                                340/572.8
2006/0290514 A1  12/2006  Sakama et al.
  (Continued)

FOREIGN PATENT DOCUMENTS

JP   03-052255 A   3/1991
JP   2007-094634 A   4/2007
  (Continued)

OTHER PUBLICATIONS

Nov. 2, 2017 Extended Search Report issued in European Patent Application No. 17173435.3.

*Primary Examiner* — Toan Ly
(74) *Attorney, Agent, or Firm* — Squire Patton Boggs (US) LLP

(57) ABSTRACT

An RFID tag includes: a flexible, sheet-shaped substrate; an antenna pattern that is formed on the substrate; an IC chip that is mounted on the substrate and that is connected to the antenna pattern; an adhesive member that adheres the IC chip to the substrate; and a reinforcement member that covers the IC chip and the adhesive, and that is at a position such that a central portion of the reinforcement member is offset along a length direction of the substrate with respect to the IC chip and the adhesive member.

20 Claims, 26 Drawing Sheets

(51) Int. Cl.
*G06K 19/077* (2006.01)
*H01L 21/82* (2006.01)

(52) U.S. Cl.
CPC ..... *G06K 19/077* (2013.01); *G06K 19/07728* (2013.01); *H01L 21/82* (2013.01)

(58) Field of Classification Search
USPC ........................................................ 235/492
See application file for complete search history.

(56) References Cited

U.S. PATENT DOCUMENTS

| | | |
|---|---|---|
| 2007/0069036 A1 | 3/2007 | Baba |
| 2010/0078487 A1 | 4/2010 | Baba et al. |
| 2013/0277433 A1* | 10/2013 | Baba ................ G06K 19/07728 235/488 |
| 2014/0252591 A1 | 9/2014 | Yu et al. |

FOREIGN PATENT DOCUMENTS

| | | |
|---|---|---|
| JP | 2007-148672 A | 6/2007 |
| JP | 2010-086361 A | 4/2010 |
| JP | 2011-221599 A | 11/2011 |

* cited by examiner

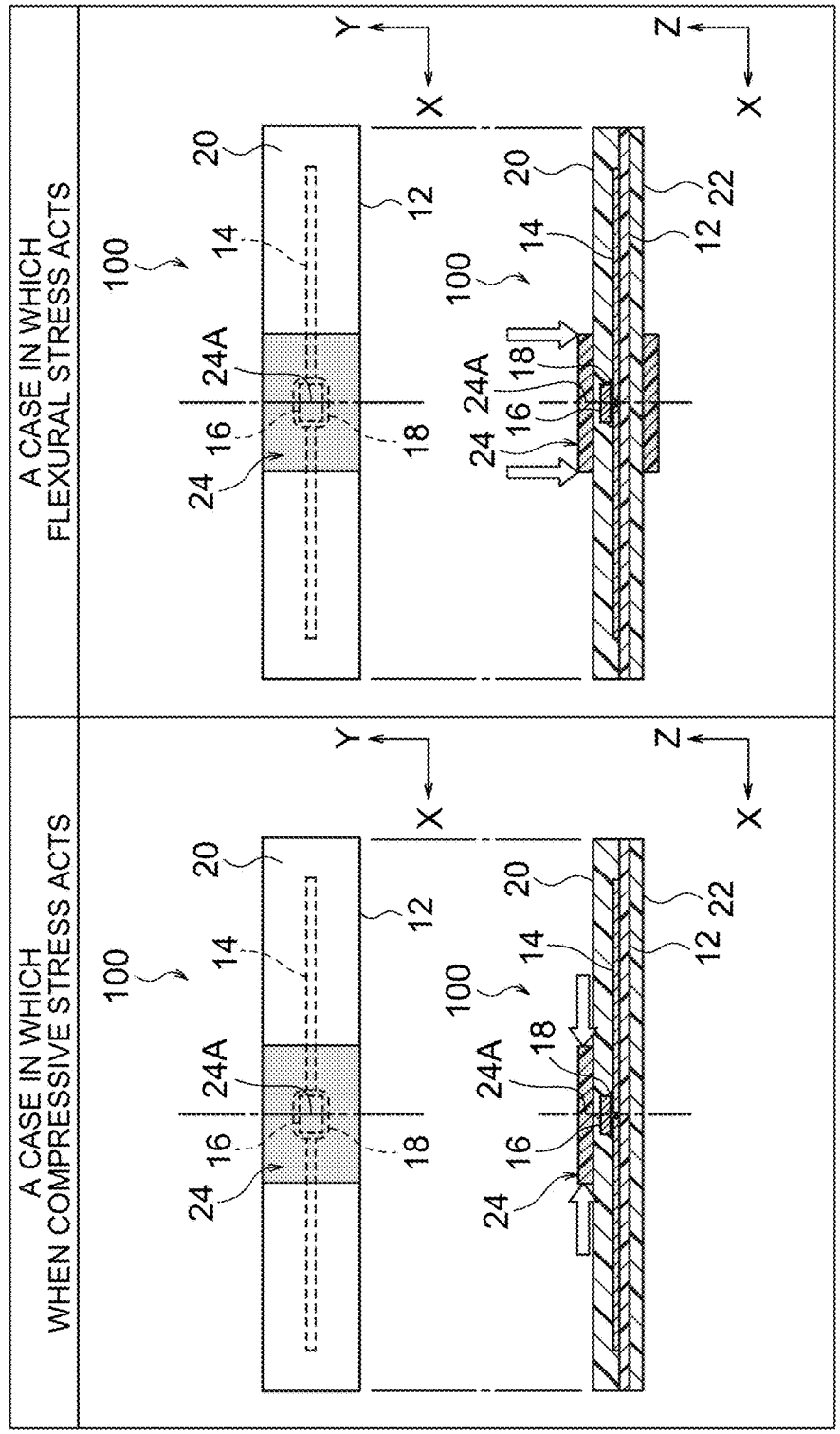

RFID TAG

CROSS-REFERENCE TO RELATED APPLICATION

This application is based on and claims the benefit of priority of the prior Japanese Patent Application No. 2016-111343, filed on Jun. 2, 2016, and the prior Japanese Patent Application No. 2016-215386 filed on Nov. 2, 2016, the entire contents of which are incorporated herein by reference.

FIELD

Technology disclosed herein relates to an RFID tag.

BACKGROUND

In recent years, radio frequency identification (RFID) tags that use electromagnetic waves to perform non-contact information exchange with an external device such as a reader/writer have come into use. One type of an RFID tag as follows. Namely, this RFID tag includes a flexible substrate, an antenna pattern that is formed on the substrate, an integrated circuit (IC) chip that is mounted on the substrate and that is connected to the antenna pattern, and an adhesive member that adheres the IC chip to the substrate.

Further, one such RFID tag, for example, includes a reinforcement member that covers the IC chip and the adhesive member. In this RFID tag, the reinforcement member is disposed such that a central portion of the reinforcement member is positioned over the IC chip and the adhesive member.

RELATED PATENT DOCUMENTS

Japanese Patent Application Laid-Open (JP-A) No. 2007-94634
JP-A 2011-221599
JP-A H03-52255
JP-A 2007-148672
JP-A 2010-86361

SUMMARY

According to an aspect of the embodiments, an RFID tag includes: a flexible, sheet-shaped substrate; an antenna pattern that is formed on the substrate; an IC chip that is mounted on the substrate and that is connected to the antenna pattern; an adhesive member that adheres the IC chip to the substrate; and a reinforcement member that covers the IC chip and the adhesive, and that is at a position such that a central portion of the reinforcement member is offset along a length direction of the substrate with respect to the IC chip and the adhesive member.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 36 is a diagram for explaining a case in which compressive stress and flexural stress act on a reinforcement member of an RFID tag according to a comparative example.

DESCRIPTION OF EMBODIMENTS

Explanation follows regarding an exemplary embodiment of technology disclosed herein.

Figure 1:
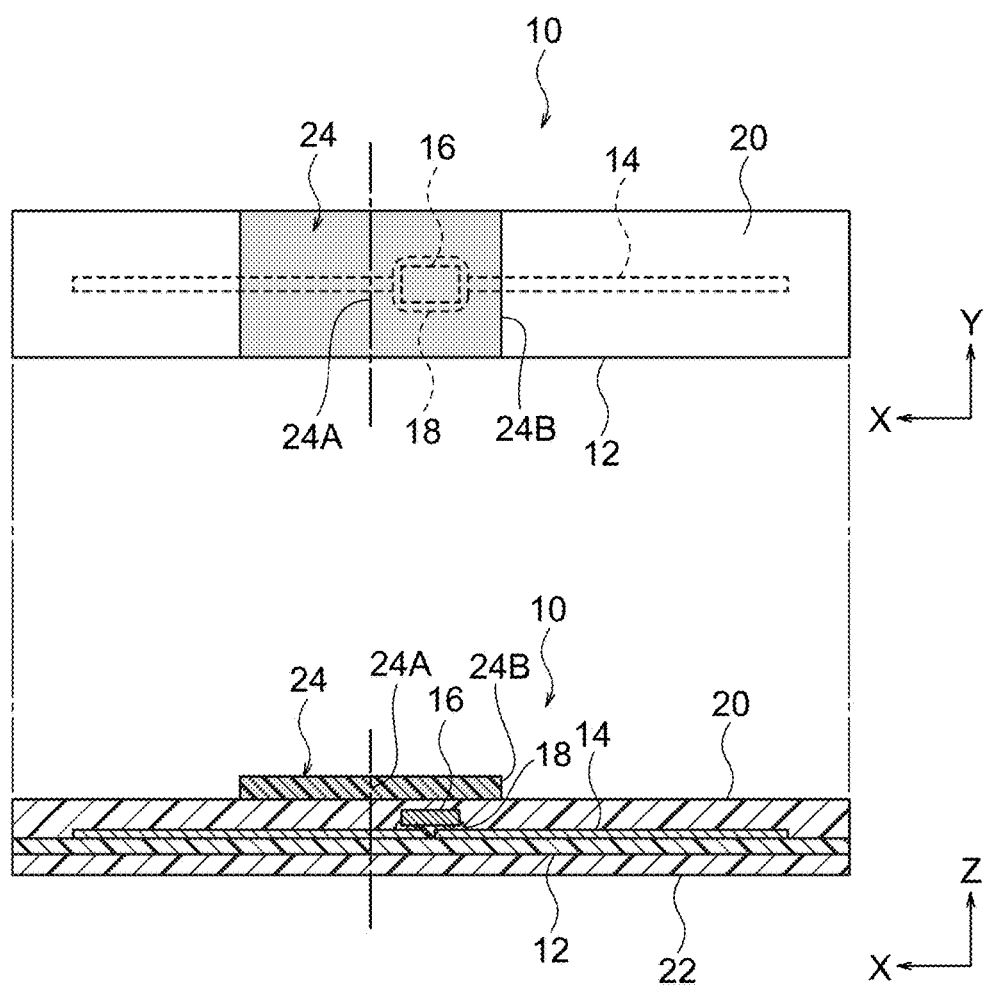
FIG. 1 is a drawing in two planes (plan view and side cross-section) of an RFID tag according to an exemplary embodiment.

As illustrated in FIG. 1, an RFID tag 10 according to an exemplary embodiment includes a substrate 12, an antenna pattern 14, an IC chip 16, an adhesive member 18, a first protective layer 20, a second protective layer 22, and a reinforcement member 24.

The substrate 12 has a rectangular sheet shape (plate shape) in plan view. In each of the drawings, the arrow X, arrow Y, and arrow Z respectively indicate the length direction (a longitudinal direction), the width direction (a transverse direction), and the thickness direction of the substrate 12. The width direction of the substrate 12 is a direction orthogonal to the length direction of the substrate 12 in a plan view of the substrate 12. The thickness direction of the substrate 12 is a direction orthogonal to the length direction of the substrate 12 in a side view of the substrate 12. The length direction, width direction, and thickness direction of the substrate 12 are the same as the length direction, width direction, and thickness direction of the RFID tag 10.

The antenna pattern 14 is formed on a front surface of the substrate 12 and extends along the length direction of the substrate 12. The antenna pattern 14 is formed using, for example, silver paste. In the present exemplary embodiment, although an example is given in which the antenna pattern 14 has a straight line shape, the antenna pattern 14 may be bowed or curved.

Figure 2:
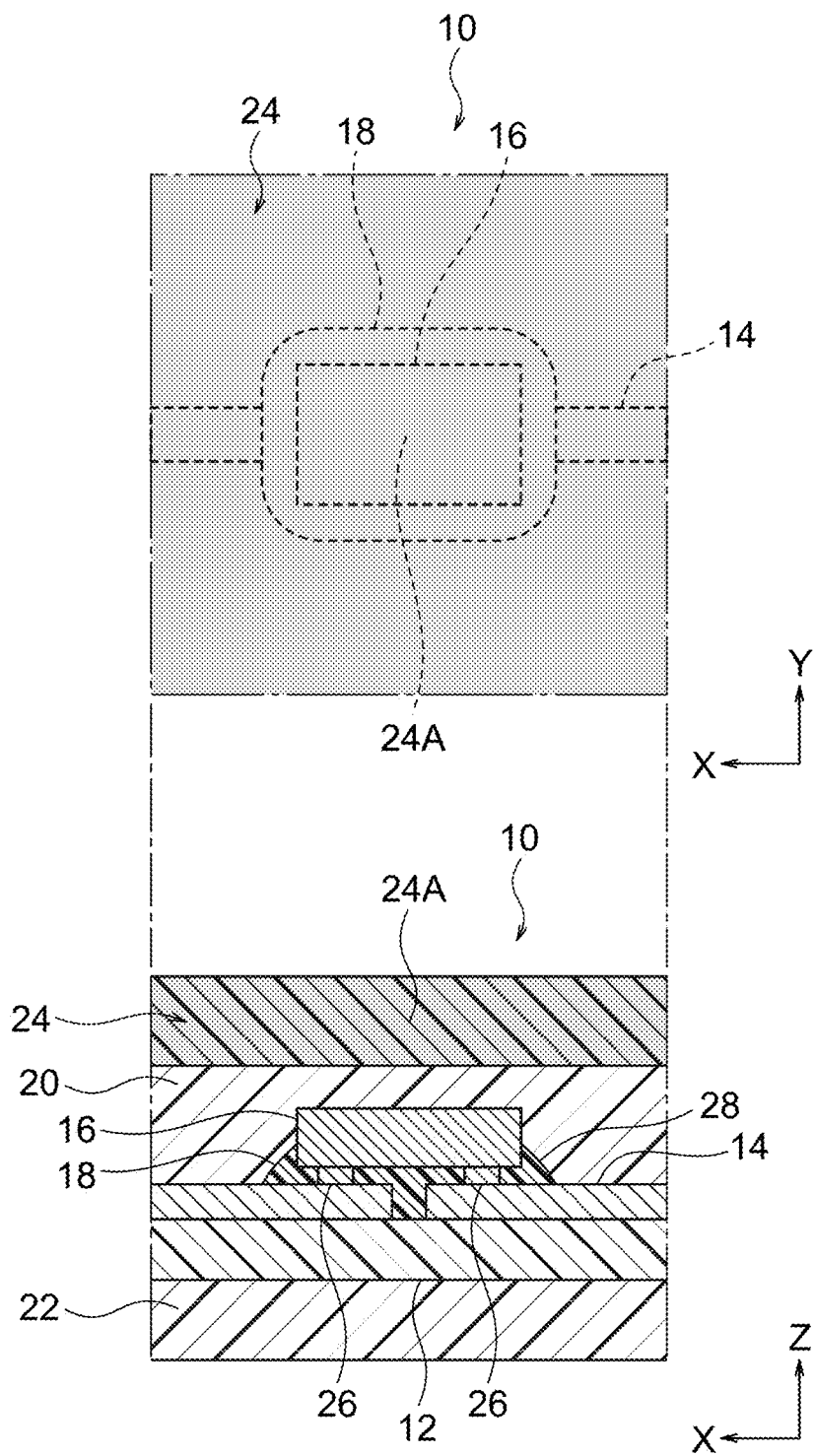
FIG. 2 is an enlarged drawing in two planes of a surrounding portion of the IC chip illustrated in FIG. 1.

The IC chip 16 is mounted on the substrate 12. The IC chip 16 has a rectangular shape in plan view and is disposed with its longitudinal direction along the length direction of the substrate 12. The IC chip 16 is disposed at a length direction central portion of the substrate 12. As illustrated in more detail in FIG. 2, the IC chip 16 includes bump portions 26. The IC chip 16 is connected to the antenna pattern 14 at the bump portions 26.

The adhesive member 18 is conductive and adheres the IC chip 16 to the substrate 12. The adhesive member 18 sticks out to the outside of the outer periphery of the IC chip 16. The portion of the adhesive member 18 that sticks out to the outsides of the outer peripheral portion of the IC chip 16 forms a fillet-shaped fillet portion 28.

As illustrated in FIG. 1, the first protective layer 20 is overlaid onto the front surface of the substrate 12, and covers the IC chip 16, the adhesive member 18, and the antenna pattern 14 described above. The second protective layer 22 is overlaid onto a back surface of the substrate 12. The first protective layer 20 and the second protective layer 22 have the same length and width as that of the substrate 12.

The reinforcement member 24 has a sheet shape (plate shape) and is overlaid onto a front surface of the first protective layer 20. The reinforcement member 24 has a rectangular shape in plan view and is disposed with its longitudinal direction along the length direction of the substrate 12. The length of the reinforcement member 24 is shorter than that of the substrate 12, and the reinforcement member 24 has the same width as that of the substrate 12.

The reinforcement member 24 is disposed at a length direction central position of the substrate 12, and the reinforcement member 24 covers the IC chip 16 and the adhesive member 18 from above the first protective layer 20. In the RFID tag 10 of the present exemplary embodiment, the length of the reinforcement member 24 and the position where the reinforcement member 24 is disposed are set such that a central portion 24A (a longitudinal direction central portion) of the reinforcement member 24 is positioned at a position offset along the length direction of the substrate 12 with respect to the IC chip 16 and the adhesive member 18. Namely, in the RFID tag 10 of the present exemplary embodiment, the central portion 24A of the reinforcement member 24 is not positioned over the IC chip 16 and the adhesive member 18.

The length of the reinforcement member 24 and the position where the reinforcement member 24 is disposed are appropriately set along the length direction of the substrate 12 such that the IC chip 16 and the adhesive member 18 are disposed between the central portion 24A and one end portion 24B (one longitudinal direction end portion) of the reinforcement member 24.

The substrate 12, the reinforcement member 24, the first protective layer 20, and the second protective layer 22 described above are, for example, formed from a resinous material such as PET (polyethylene terephthalate) or PEN (polyethylene naphthalate), and are all flexible. In a hardened state, the adhesive member 18 has a higher flexural rigidity than the substrate 12, the reinforcement member 24, the first protective layer 20, and the second protective layer 22. Since the substrate 12, the reinforcement member 24, the first protective layer 20, and the second protective layer 22 are flexible, the RFID tag 10 as a whole is also flexible.

Detailed explanation follows regarding a method for manufacturing the RFID tag 10 described above.

Figure 3:
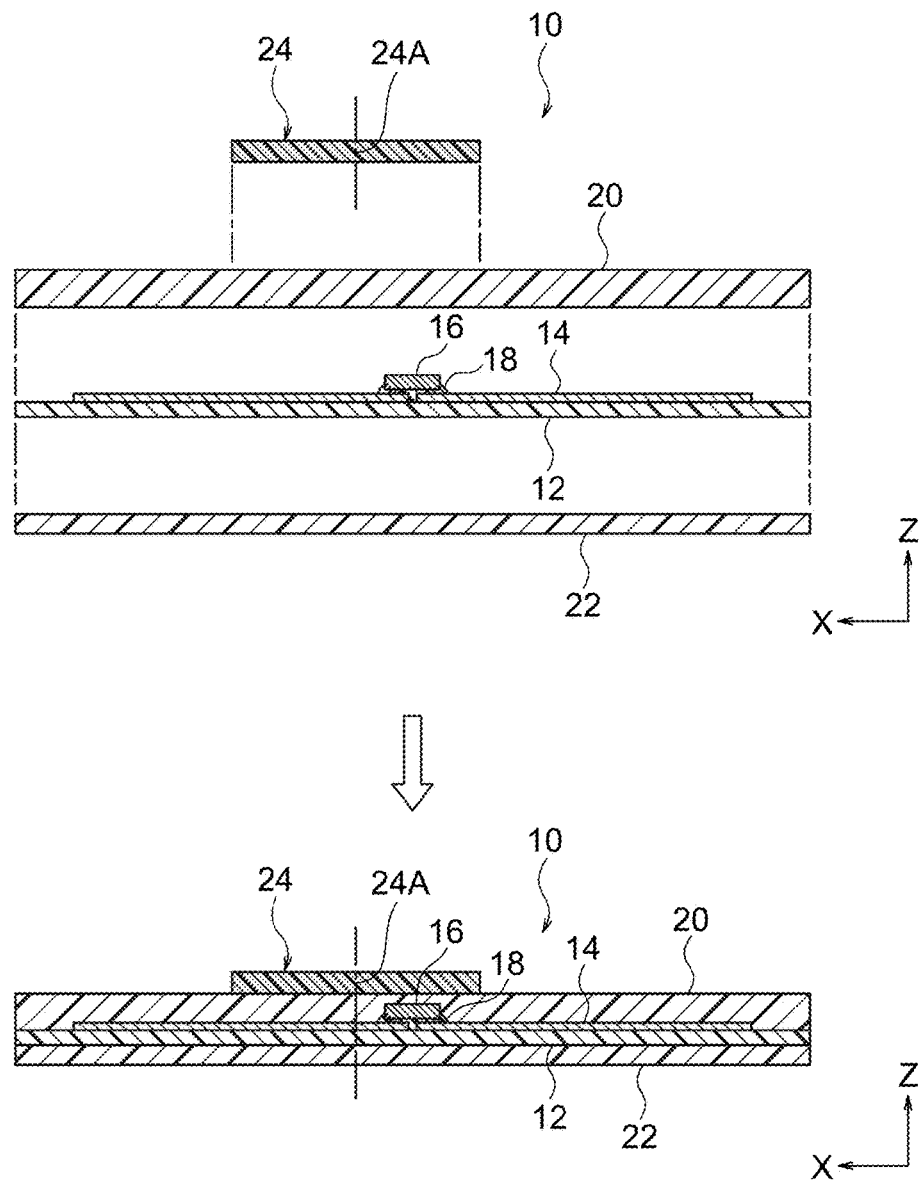
FIG. 3 is a diagram for explaining a lamination process of a method for manufacturing an RFID tag according to the exemplary embodiment.

The method for manufacturing the RFID tag 10 of the present exemplary embodiment includes a lamination process and a dicing process. In the lamination process, the substrate 12, the reinforcement member 24, the first protective layer 20, and the second protective layer 22 are stuck together as illustrated in FIG. 3. Further, in the lamination process, the position where the reinforcement member 24 is disposed is set such that the central portion 24A of the reinforcement member 24 is positioned at a position offset along the length direction of the substrate 12 with respect to the IC chip 16 and the adhesive member 18. Note that in a process prior to the lamination process, the antenna pattern 14 is pre-formed on the substrate 12 and the IC chip 16 is adhered to the substrate 12 using the adhesive member 18.

Figure 4:
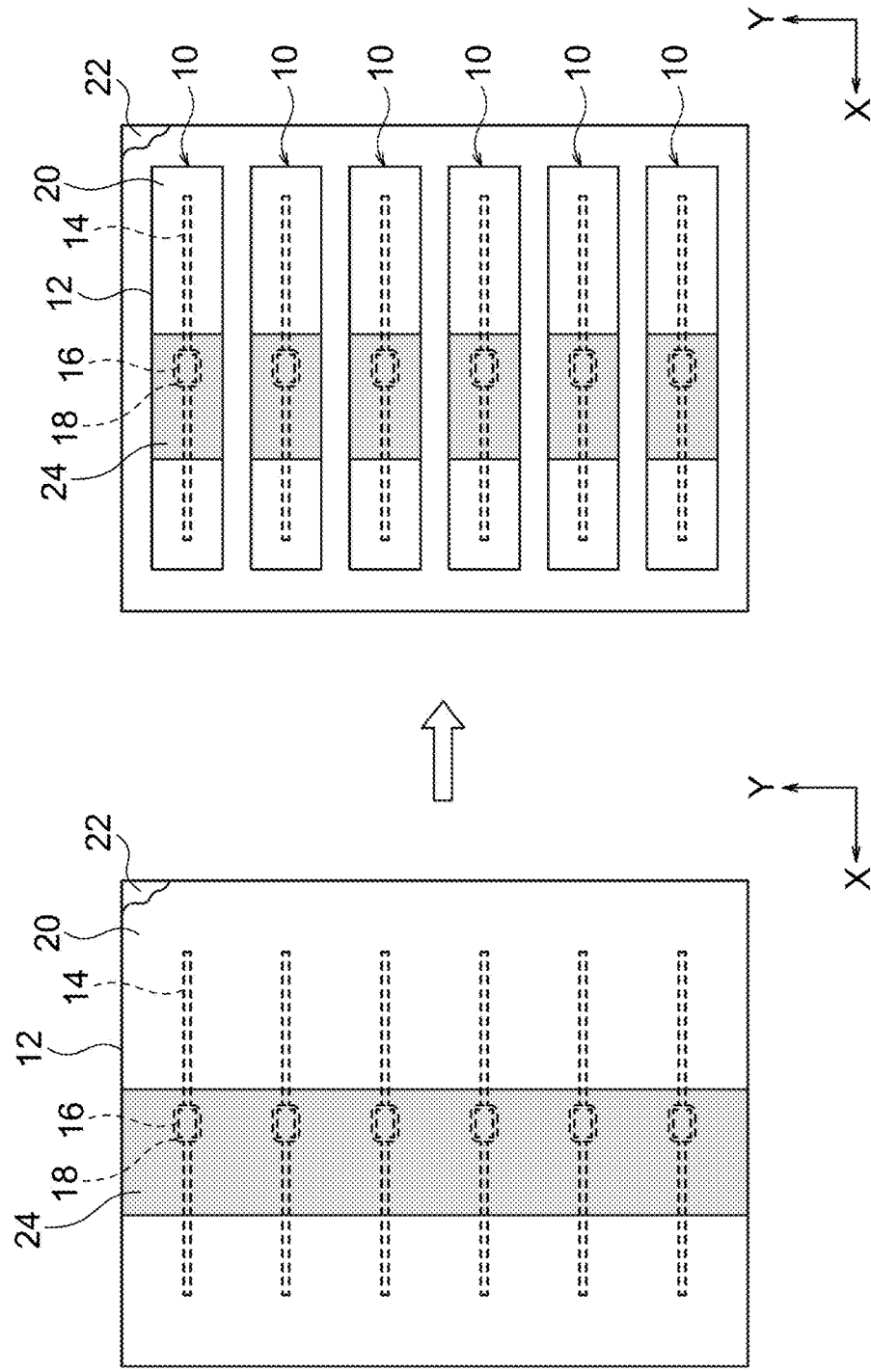
FIG. 4 is a diagram for explaining a dicing process of a method for manufacturing an RFID tag according to the exemplary embodiment.

Further, in the lamination process, as illustrated in the left diagram of FIG. 4, antenna patterns 14 for each of plural RFID tags are formed on a single substrate 12 of a size large enough for the plural RFID tags, and IC chips 16 for each of the plural RFID tags are mounted on the single substrate 12. Further, a first protective layer 20 and a second protective layer 22 for each of the plural RFID tags are stuck to the single substrate 12, and a reinforcement member 24 for each of the plural RFID tags is stuck to the first protective layer 20. Namely, in the method for manufacturing an RFID tag of the present exemplary embodiment, the configuration members for plural RFID tags are stuck together all at once. An ordinary laminator, for example, can be used for such a lamination process.

Then, as illustrated moving from the left diagram to the right diagram in FIG. 4, in the dicing process, portions corresponding to an external profile of each RFID tag are cut by a method such as half-cutting or laser cutting. Plural diced RFID tags 10 are thereby manufactured.

Explanation follows regarding features of the reinforcement member 24 provided to the RFID tag 10 described above.

Figure 5:
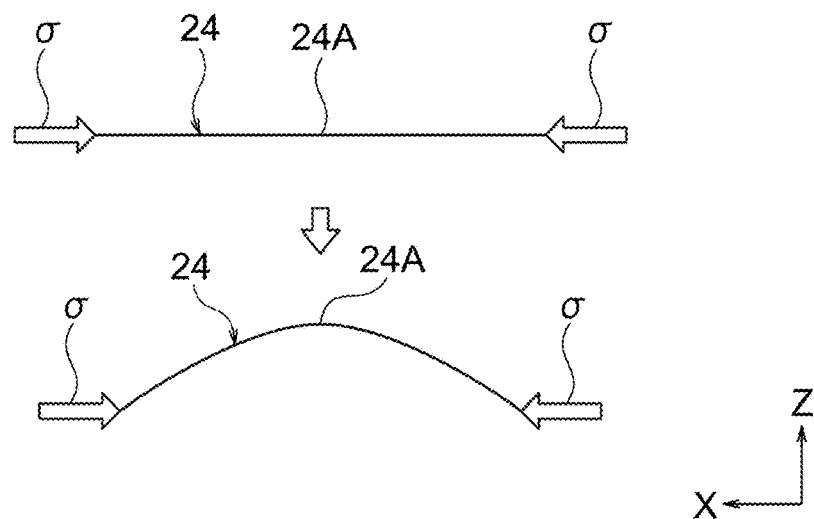
FIG. 5 is a diagram for explaining a case in which compressive stress acts on a reinforcement member employed in an RFID tag according to the exemplary embodiment.

A reinforcement member 24 is illustrated as a line segment in FIG. 5. As illustrated in FIG. 5, in cases in which compressive stress σ acts on the reinforcement member 24, bowing due to buckling occurs in the reinforcement member 24 when the reinforcement member 24 has a linear extension ratio $\lambda > 100$. When this occurs, the reinforcement member 24 bends at the central portion 24A. When the reinforcement member 24 bends at the central portion 24A, the bend line extends along a direction perpendicular to the direction along which compression acts in a plan view of the reinforcement member 24.

Figure 6:
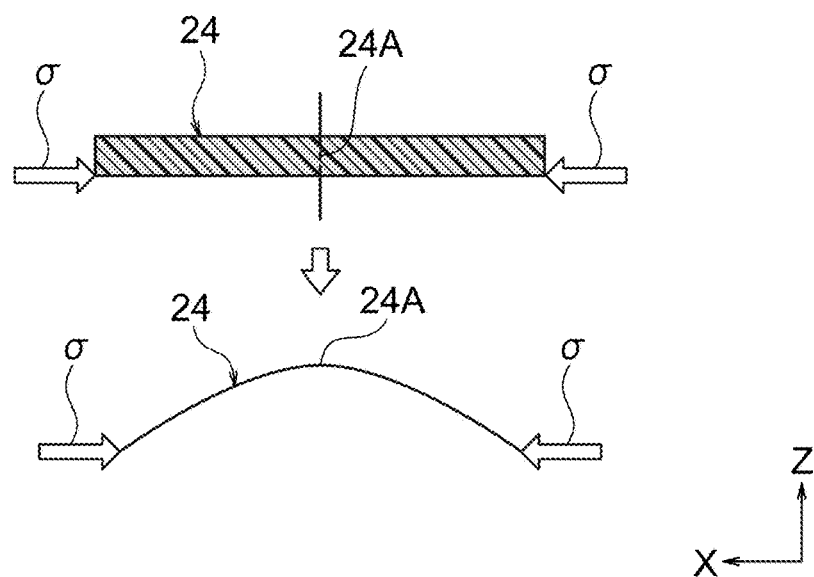
FIG. 6 is a diagram for explaining a case in which eccentric compressive stress acts on a reinforcement member employed in an RFID tag according to the exemplary embodiment.

The upper diagram in FIG. 6 illustrates the reinforcement member 24 in vertical cross-section, and the lower diagram in FIG. 6 illustrates the reinforcement member 24 as a line segment. As illustrated in FIG. 6, in cases in which eccentric compressive stress σ acts on the reinforcement member 24, bowing due to compression failure occurs in the reinforcement member 24 when the linear extension ratio λ of the reinforcement member 24 is ≤100. When this occurs, the reinforcement member 24 bends at the central portion 24A.

Thus, in cases in which compressive stress acts on the reinforcement member 24, the reinforcement member 24 bends at the central portion 24A when the reinforcement member 24 undergoes buckling or compression failure.

Figure 7:
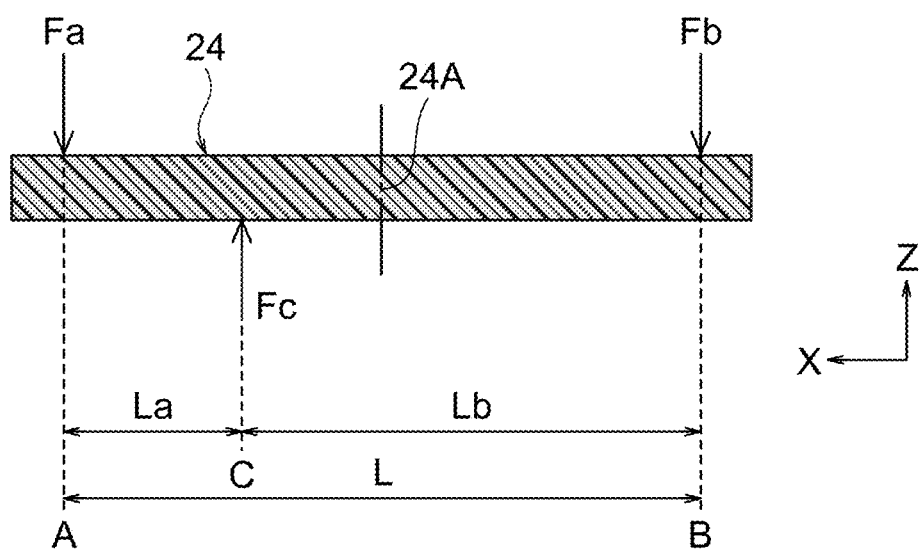
FIG. 7 is a diagram for explaining a case in which flexural stress acts on a reinforcement member employed in an RFID tag according to the exemplary embodiment.

FIG. 7 illustrates the reinforcement member 24 in vertical cross-section. In FIG. 7, downward loads Fa, Fb act on both end portions of the reinforcement member 24, and an upward load Fc acts between both end portions of the reinforcement member 24. The length La is the length from an input point A for the load Fa to an input point C for the load Fc, and the length Lb is the length from an input point B for the load Fb to the input point C of the load Fc. The length L is the sum of the length La and the length Lb, and is the length from the input point A of the load Fa to the input point B of the load Fb.

The balance of forces is expressed by Equation (1), and the balance of rotational moments about the input point A of the load Fa is expressed by Equation (2). The flexural stress σ acting on the reinforcement member 24 at the input point C of the load Fc is expressed by Equation (3). Equation (4) is obtained by solving for Equation (1) to Equation (3). Note that Z in Equation (4) is a section modulus.

$$Fc = Fa + Fb \tag{1}$$

$$La \times Fc = (La + Lb) \times Fb \tag{2}$$

$$\sigma = M/Z = (La \times Lb)/Z \tag{3}$$

$$\sigma = \{(La \times Lb/L) \times Fc\}/Z \tag{4}$$

Setting the smaller of tensile strength or compressive strength as σb, the reinforcement member 24 bends when $\sigma > \sigma b$. Equation (5) is thereby obtained.

$$\{(La \times Lb/L) \times Fc\}/Z > \sigma b \tag{5}$$

According to Equation (5), the load Fc is minimized when La=L/2. Namely, the load Fc is at a minimum when La=Lb=L/2. Loads Fa, Fb are also minimized when this occurs. As a result, the reinforcement member 24 is most liable to flex when a load is added to the central portion 24A of the reinforcement member 24. Thus, in cases in which flexural stress acts on the reinforcement member 24, the reinforcement member 24 bends at the central portion 24A.

Explanation follows regarding the operation and advantageous effects of the present exemplary embodiment.

FIG. 36 illustrates an RFID tag 100 according to a comparative example. In the RFID tag 100 according to the comparative example, in contrast to the RFID tag 10 according to the exemplary embodiment described above, the central portion 24A of the reinforcement member 24 is positioned over the IC chip 16 and the adhesive member 18. The left diagram of FIG. 36 illustrates a case in which compressive stress acts on the reinforcement member 24 along the length direction of the substrate 12, and the right diagram of FIG. 36 illustrates a case in which flexural stress acts on both end portions of the reinforcement member 24.

As explained with respect to the features of the reinforcement member 24 described above, the reinforcement member 24 bends at the central portion 24A both in cases in which compressive stress acts on the reinforcement member 24 and in cases in which flexural stress acts on the reinforcement member 24.

Thus, as illustrated in FIG. 36, in cases in which the central portion 24A of the reinforcement member 24 is positioned over the IC chip 16 and the adhesive member 18, flexural stress acts on the IC chip 16 in accordance with bending of the reinforcement member 24 at the central portion 24A, and there is a concern that cracks will arise in the IC chip 16. Even in cases in which cracks do not arise in the IC chip 16, in accordance with bending of the reinforcement member 24 at the central portion 24A, stress concentrates at the edges of the adhesive member 18 (a boundary between portions where the fillet portion is present and portions where the fillet portion is not present), and there is a concern that breaks in the antenna pattern 14 will occur at the edges of the adhesive member 18.

In contrast thereto, in the RFID tag 10 according to the present exemplary embodiment illustrated in FIG. 1, although the reinforcement member 24 is covering the IC chip 16 and the adhesive member 18, the reinforcement member 24 is at a position where the central portion 24A is offset along the length direction of the substrate 12 with respect to the IC chip 16 and the adhesive member 18. Accordingly, even if compressive stress or flexural stress acts on the RFID tag 10 such that the reinforcement member 24 bends at the central portion 24A, flexural stress can be suppressed from acting on the IC chip 16, thus enabling the occurrence of cracks in the IC chip 16 to be suppressed. Moreover, even if the reinforcement member 24 bends at the central portion 24A, stress can be suppressed from concentrating at the edges of the adhesive member 18, thus enabling breaks in the antenna pattern 14 at the edges of the adhesive member 18 to be suppressed.

Moreover, the length of the reinforcement member 24 and the position where the reinforcement member 24 is disposed are appropriately set along the length direction of the substrate 12 such that the IC chip 16 and the adhesive member 18 are disposed between the central portion 24A of the reinforcement member 24 and one end portion 24B (one longitudinal direction end portion) of the reinforcement member 24. The IC chip 16 and the adhesive member 18 are thus entirely covered by the portion of the reinforcement member 24 between the central portion 24A and the one end portion 24B. Accordingly, even if the reinforcement member 24 bends at the central portion 24A, a state in which the IC chip 16 and the adhesive member 18 are reinforced by the reinforcement member 24 can be maintained.

Explanation follows regarding example applications of the RFID tag 10.

The RFID tag 10 of the present exemplary embodiment performs uses electromagnetic waves to perform non-contact information exchange with an external device such as a reader/writer. Namely, electromagnetic waves emitted from the external device are received with the antenna pattern 14, and signals received with the antenna pattern 14 are processed by the IC chip 16. Signals output from the IC chip 16 are also transmitted from the antenna pattern 14 as electromagnetic waves.

The RFID tag 10 of the present exemplary embodiment is, for example, used to manage items. One example of such an item is a mat that is placed at the entrance of a shop or the like. The back surface of this type of mat is sometimes formed using rubber, and the RFID tag 10 of the present exemplary embodiment is embedded into the rubber when molding the rubber on the back surface of the mat. When the rubber cools and shrinks after molding the rubber, compressive stress along the length direction acts on the RFID tag 10. However, in the RFID tag 10 of the present exemplary embodiment, even when acted upon by compressive stress, as described above, the occurrence of cracks in the IC chip 16 and breaks in the antenna pattern 14 at the edges of the adhesive member 18 can be suppressed.

Another example of an item to which the RFID tag 10 of the present exemplary embodiment can be applied is a mop used for cleaning a shop or the like. Such a mop generally has a wiping portion made of cloth at a leading end of the mop. The RFID tag 10 of the present exemplary embodiment is attached to the wiping portion at the leading end of the mop. When flexural load acts on the wiping portion while wiping is performed using the wiping portion, flexural stress sometimes acts on both length direction end portions of the RFID tag 10. However, in the RFID tag 10 of the present exemplary embodiment, even when acted upon by flexural stress, as described above, the occurrence of cracks in the IC chip 16 and breaks in the antenna pattern 14 at the edges of the adhesive member 18 can be suppressed.

Note that the present example applications illustrate examples of items to which the RFID tag 10 of the present exemplary embodiment can be applied, and the RFID tag 10 of the present exemplary embodiment can obviously be applied to various items other than the above.

Explanation follows regarding modified examples of the present exemplary embodiment.

First Modified Example

In the above exemplary embodiment, as illustrated in FIG. 1, the reinforcement member 24 is disposed only on a front side of the substrate 12. However, as in the first modified example of FIG. 8, a first reinforcement member 24-1 may be disposed on the front side of the substrate 12, and a second reinforcement member 24-2 may be disposed on a back side of the substrate 12.

Figure 8:
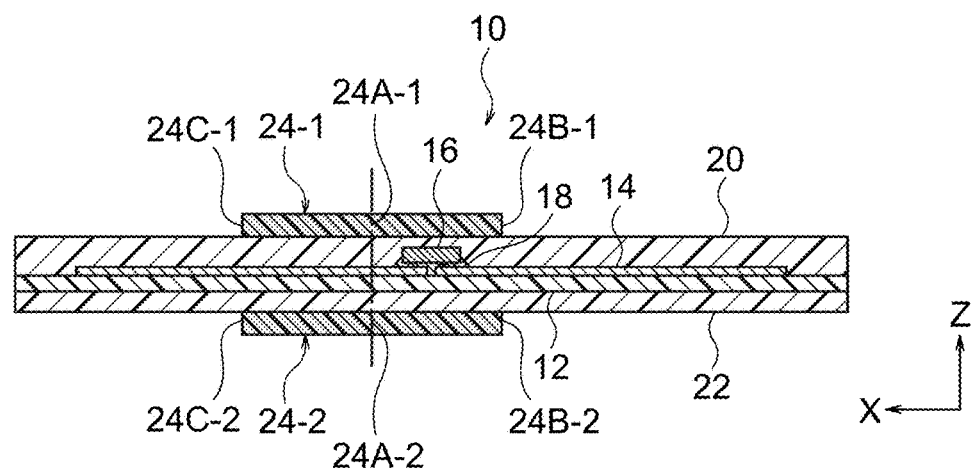
FIG. 8 is a vertical cross-section illustrating a first modified example of an RFID tag according to the exemplary embodiment.

Note that in the first modified example illustrated in FIG. 8, the longitudinal direction lengths of the first reinforcement member 24-1 and the second reinforcement member 24-2 are the same. Both the first reinforcement member 24-1 and the second reinforcement member 24-2 cover the IC chip 16 and the adhesive member 18. The first reinforcement member 24-1 and the second reinforcement member 24-2 are each at a position where respective central portions 24A-1, 24A-2 (longitudinal direction central portions) are offset along the length direction of the substrate 12 with respect to the IC chip 16 and the adhesive member 18.

The first central portion 24A-1 of the first reinforcement member 24-1 and the second central portion 24A-2 of the second reinforcement member 24-2 are positioned on the same length direction side of the substrate 12 with respect to the IC chip 16 and the adhesive member 18. The first central portion 24A-1 of the first reinforcement member 24-1 and the second central portion 24A-2 of the second reinforcement member 24-2 are also in the same position as each other along the length direction of the substrate 12.

In the first modified example, the RFID tag 10 includes the first reinforcement member 24-1 disposed on the front side of the substrate 12 and the second reinforcement member 24-2 disposed on the back side of the substrate 12. Accordingly, the IC chip 16 and the adhesive member 18 can be reinforced from both the front side and the back side of the substrate 12, thereby enabling the occurrence of cracks in the IC chip 16 and breaks in the antenna pattern 14 at the edges of the adhesive member 18 to be more effectively suppressed.

The first central portion 24A-1 of the first reinforcement member 24-1 and the second central portion 24A-2 of the second reinforcement member 24-2 are also positioned on the same length direction side of the substrate 12 with respect to the IC chip 16 and the adhesive member 18. Accordingly, even in cases in which compressive stress or flexural stress acts on the RFID tag 10, the first reinforcement member 24-1 and the second reinforcement member 24-2 are able to bend at the same length direction side of the substrate 12 with respect to the IC chip 16 and the adhesive member 18. Bending of the RFID tag 10 at an unintended position over the IC chip 16 and the adhesive member 18 can thereby be restricted.

In addition, the first central portion 24A-1 of the first reinforcement member 24-1 and the second central portion 24A-2 of the second reinforcement member 24-2 are at the same position as each other along the length direction of the substrate 12. Accordingly, even in cases in which compressive stress or flexural stress acts on the RFID tag 10, the first reinforcement member 24-1 and the second reinforcement member 24-2 are able to bend at the same position as each other. Bending of the RFID tag 10 at an unintended position over the IC chip 16 and the adhesive member 18 can thereby be more effectively restricted.

Second Modified Example

In the first modified example above, the longitudinal direction lengths of the first reinforcement member 24-1 and the second reinforcement member 24-2 are the same as each other. However, as in the second modified example of FIG. 9, the longitudinal direction length of the second reinforcement member 24-2 may be longer than that of the first reinforcement member 24-1.

Figure 9:
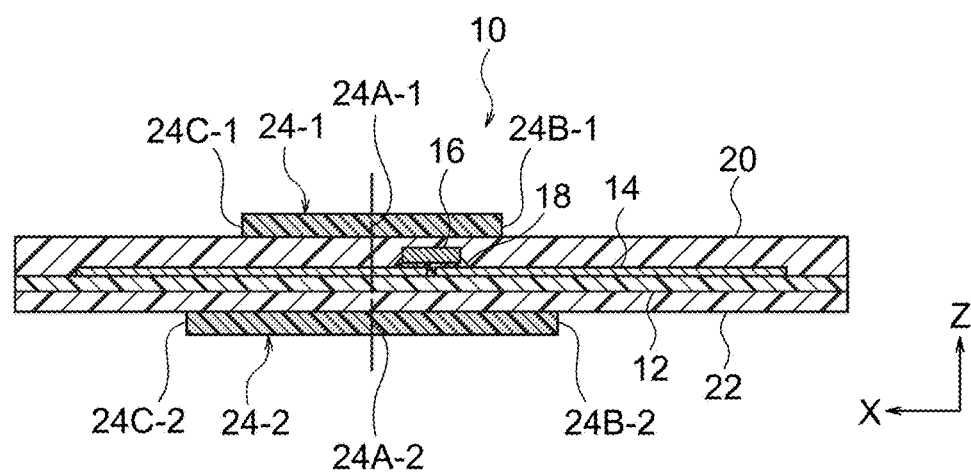
FIG. 9 is a vertical cross-section illustrating a second modified example of an RFID tag according to the exemplary embodiment.

Note that in the second modified example illustrated in FIG. 9, although the longitudinal direction length of the second reinforcement member 24-2 is longer than that of the first reinforcement member 24-1, the longitudinal direction length of the first reinforcement member 24-1 may be longer than that of the second reinforcement member 24-2. Namely, the longitudinal direction lengths of the first reinforcement member 24-1 and the second reinforcement member 24-2 may be different from each other.

Third Modified Example

Figure 10:
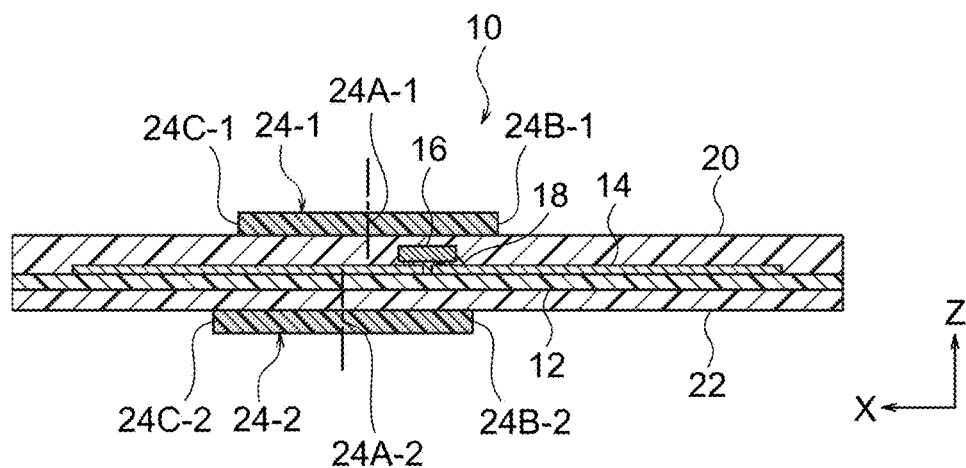
FIG. 10 is a vertical cross-section illustrating a third modified example of an RFID tag according to the exemplary embodiment.

In the first and second modified examples above, the first central portion 24A-1 of the first reinforcement member 24-1 and the second central portion 24A-2 of the second reinforcement member 24-2 are at the same position as each other along the length direction of the substrate 12. However, as in the third modified example of FIG. 10, the positions of the first central portion 24A-1 of the first reinforcement member 24-1 and the second central portion 24A-2 of the second reinforcement member 24-2 may be offset from each other along the length direction of the substrate 12.

With such a configuration, bending of the first reinforcement member 24-1 at the first central portion 24A-1 can be suppressed by the second reinforcement member 24-2. Bending of the second reinforcement member 24-2 at the second central portion 24A-2 can also be suppressed by the first reinforcement member 24-1.

Fourth Modified Example

In the first modified example above, as illustrated in FIG. 8, one end portion 24B-1 of the first reinforcement member 24-1 and one end portion 24B-2 of the second reinforcement member 24-2 are at the same position as each other along the length direction of the substrate 12. Another end portion 24C-1 of the first reinforcement member 24-1 and another end portion 24C-2 of the second reinforcement member 24-2 are also at the same position as each other along the length direction of the substrate 12.

Figure 11:
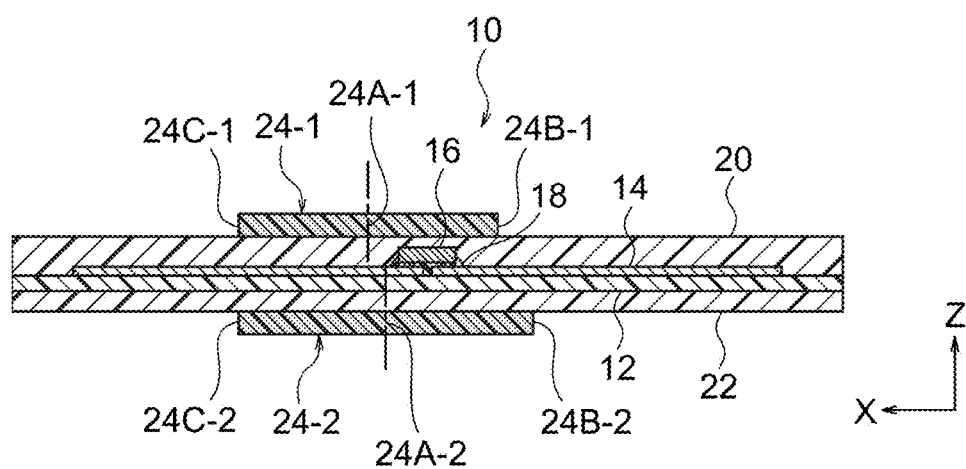
FIG. 11 is a vertical cross-section illustrating a fourth modified example of an RFID tag according to the exemplary embodiment.

However, as in the fourth modified example of FIG. 11, the positions of the one end portion 24B-1 of the first reinforcement member 24-1 and the one end portion 24B-2 of the second reinforcement member 24-2 may be offset from each other along the length direction of the substrate 12. In the fourth modified example illustrated in FIG. 11, as an example, the one end portion 24B-1 of the first reinforcement member 24-1 is positioned closer to the length direction center of the substrate 12 than the one end portion 24B-2 of the second reinforcement member 24-2.

With such a configuration, the one end portion 24B-1 of the first reinforcement member 24-1 is reinforced by a portion of the second reinforcement member 24-2 between the second central portion 24A-2 and the one end portion 24B-2. Thus, for example, even in cases in which flexural stress concentrates on the one end portion 24B-1 of the first reinforcement member 24-1, bending of the RFID tag 10 starting from the one end portion 24B-1 of the first reinforcement member 24-1 can be suppressed by the second reinforcement member 24-2.

Note that in the second and the third modified examples described above and illustrated in FIG. 9 and FIG. 10, the positions of the one end portion 24B-1 of the first reinforcement member 24-1 and the one end portion 24B-2 of the second reinforcement member 24-2 are offset from each other. In addition, in the second and the third modified examples described above and illustrated in FIG. 9 and FIG. 10, the positions of the other end portion 24C-1 of the first reinforcement member 24-1 and the other end portion 24C-2 of the second reinforcement member 24-2 are offset from each other.

Thus, when the positions of both end portions of the first reinforcement member 24-1 and the second reinforcement member 24-2 are offset from each other, even in cases in which flexural stress concentrates on either end portion of the two end portions of one of the reinforcement members, bending of the RFID tag 10 is able to be suppressed by the other reinforcement member.

Fifth Modified Example

Figure 12:
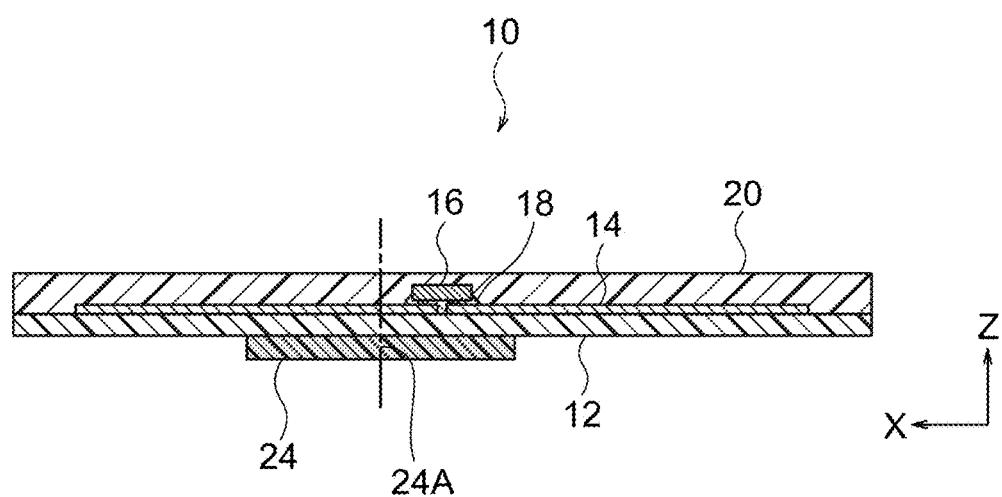
FIG. 12 is a vertical cross-section illustrating a fifth modified example of an RFID tag according to the exemplary embodiment.

In the above exemplary embodiment, as illustrated in FIG. 1, the second protective layer 22 is provided at the back side of the substrate 12. However, as in the fifth modified example of FIG. 12, configuration may be such that a second protective layer is not provided at the back side of the substrate 12. As in the fifth modified example of FIG. 12, the reinforcement member 24 may also be directly overlaid onto the back surface of the substrate 12, namely, onto the surface on the opposite side to the side where the IC chip 16 is mounted. Thus, the cost of the RFID tag 10 can be reduced by omitting the second protective layer at the back side of the substrate 12.

Sixth Modified Example

Figure 13:
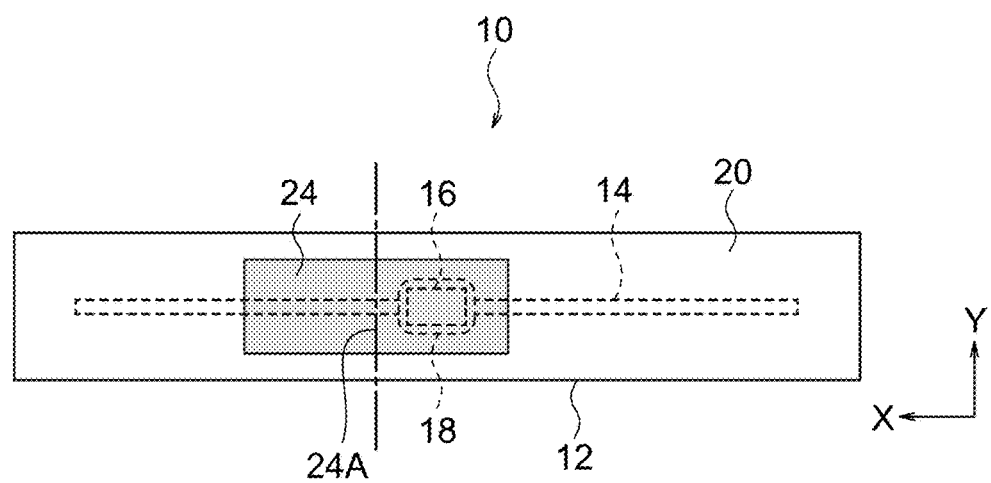
FIG. 13 is a plan view illustrating a sixth modified example of an RFID tag according to the exemplary embodiment.

In the above exemplary embodiment, as illustrated in FIG. 1, the dimensions of the reinforcement member 24 and the substrate 12 are the same along the width direction of the substrate 12. However, as illustrated in FIG. 13, the reinforcement member 24 may be dimensioned smaller than the substrate 12 along the width direction of the substrate 12. With such a configuration, the material cost of the reinforcement member 24 can be reduced, hence the cost of the RFID tag 10 can be reduced.

Seventh Modified Example

Figure 14:
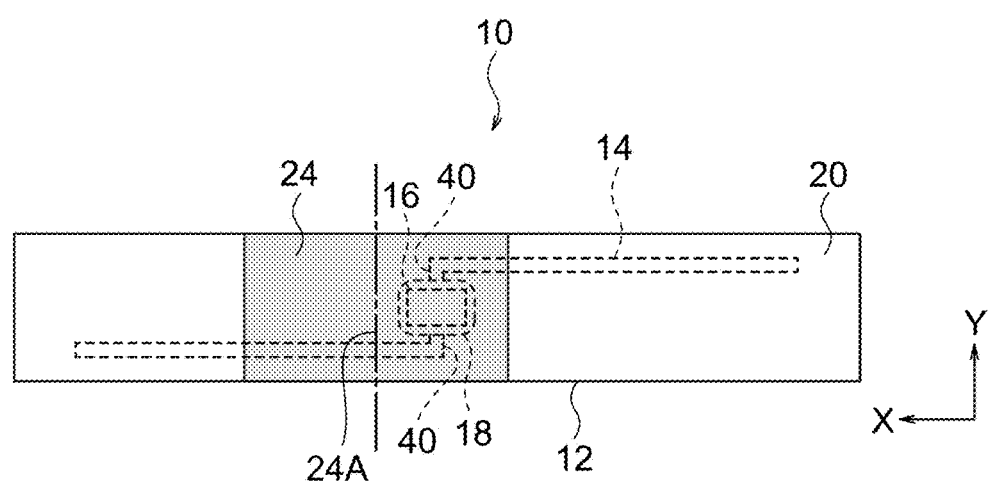
FIG. 14 is a plan view illustrating a seventh modified example of an RFID tag according to the exemplary embodiment.

In the above exemplary embodiment, as illustrated in FIG. 1, the entire antenna pattern 14, including connection portions on the antenna pattern 14 to the IC chip 16, extends along the length direction of the substrate 12. However, as in the seventh modified example of FIG. 14, connection portions 40 on the antenna pattern 14 to the IC chip 16 may extend along the width direction of the substrate 12 with the reinforcement member 24 covering the connection portions 40.

With such a configuration, even in cases in which compressive stress along the length direction acts on the RFID tag 10, compressive stress can be suppressed from acting along the longitudinal direction of the connection portions 40. Moreover, even when flexural stress acts on both length direction end portions of the RFID tag 10, flexural stress can be suppressed from acting on both longitudinal direction end portions of the connection portions 40. This enables breaks in the antenna pattern 14 to be more effectively suppressed.

Eighth Modified Example

Figure 15:
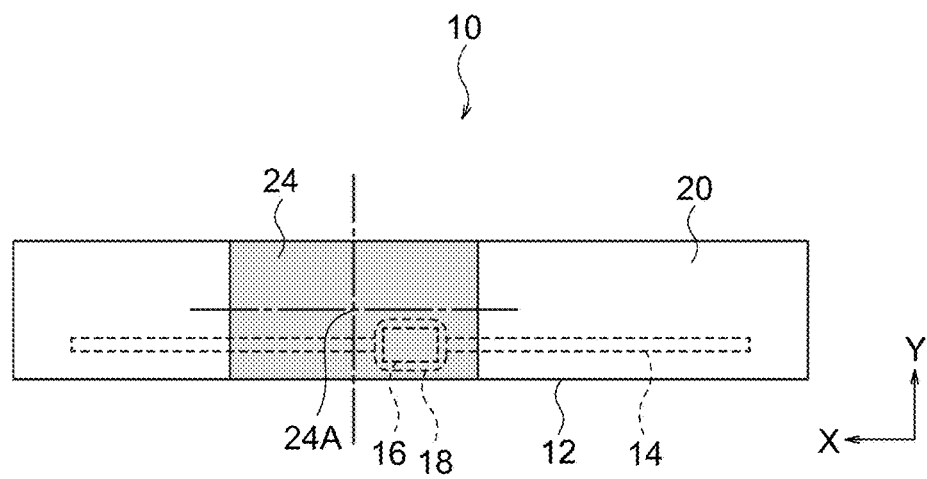
FIG. 15 is a plan view illustrating an eighth modified example of an RFID tag according to the exemplary embodiment.

In the above exemplary embodiment, as illustrated in FIG. 1, the positions of the IC chip 16 and the adhesive member 18 are offset along the length direction of the substrate 12 with respect to the central portion 24A of the reinforcement member 24. However, as in the eighth modified example of FIG. 15, the positions of the IC chip 16 and the adhesive member 18 may be offset along each of the length direction and the width direction of the substrate 12 with respect to the central portion 24A (a central portion along both the longitudinal direction and the transverse direction) of the reinforcement member 24. Namely, in other words, the central portion 24A of the reinforcement member 24 may be at a position offset along both the length direction and the width direction of the substrate 12 with respect to the IC chip 16 and the adhesive member 18.

With such a configuration, even if compressive stress along the width direction acts on the RFID tag 10 or if flexural stress acts on both width direction end portions of the RFID tag 10 such that the reinforcement member 24 bends at a transverse direction central portion, flexural stress can be suppressed from acting on the IC chip 16. This enables the occurrence of cracks in the IC chip 16 to be suppressed. Moreover, even if the reinforcement member 24 bends at a width direction central portion, stress can be suppressed from concentrating at the edges of the adhesive member 18, thus enabling breaks in the antenna pattern 14 at the edges of the adhesive member 18 to be suppressed.

Ninth Modified Example

Figure 16:
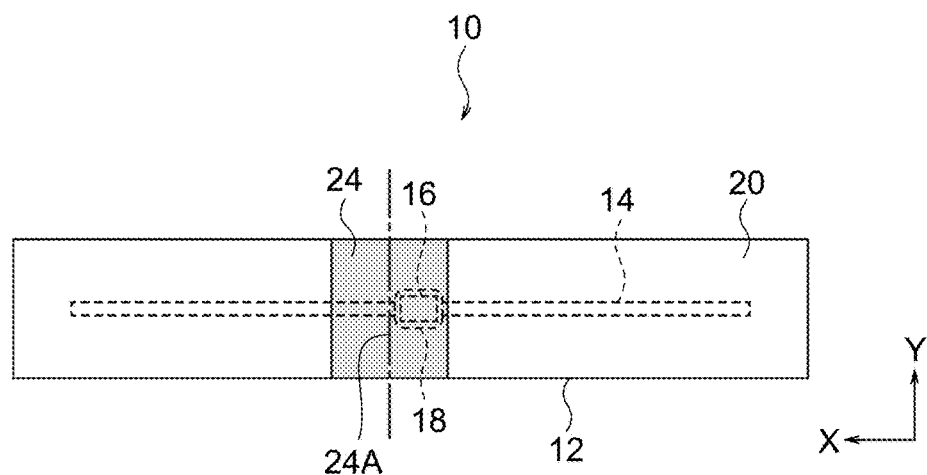
FIG. 16 is a plan view illustrating a ninth modified example of an RFID tag according to the exemplary embodiment.

In the above exemplary embodiment, as illustrated in FIG. 1, the reinforcement member 24 is disposed with its longitudinal direction along the length direction of the substrate 12. However, as in the ninth modified example of FIG. 16, the reinforcement member 24 may be disposed with its longitudinal direction along the width direction of the substrate 12.

With such a configuration, the longitudinal direction of the reinforcement member 24, this being the direction along which the reinforcement member 24 is liable to flex, is orthogonal to the length direction of the RFID tag 10. Thus, even in cases in which compressive stress along the length direction acts on the RFID tag 10 or flexural stress acts on both length direction end portions of the RFID tag 10, bending of the reinforcement member 24 at the central portion 24A (transverse direction central portion) can be suppressed.

Tenth Modified Example

Figure 17:
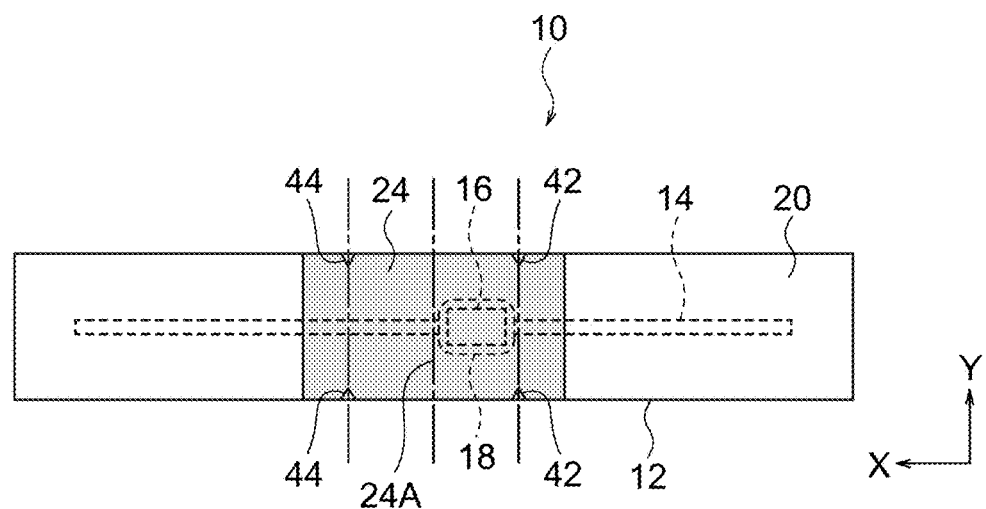
FIG. 17 is a plan view illustrating a tenth modified example of an RFID tag according to the exemplary embodiment.

In a tenth modified example illustrated in FIG. 17, in contrast to the above exemplary embodiment, the reinforcement member 24 includes a pair of notches 42 and a pair of notches 44. Both pairs of the notches 42, 44 are open at both width direction sides of the substrate 12. The one pair of notches 42 are at the same position as each other along the length direction of the substrate 12, and other pair of notches 44 are at the same position as each other along the length direction of the substrate 12. Each of the one pair of notches 42 is formed at a position offset toward one length direction side of the substrate 12 with respect to the IC chip 16 and the adhesive member 18. In contrast thereto, each of the other pair of notches 44 is formed at a position offset toward the other length direction side of the substrate 12 with respect to the IC chip 16 and the adhesive member 18.

With such a configuration, in cases in which compressive stress along the length direction acts on the RFID tag 10 or flexural stress acts on both length direction end portions of the RFID tag 10, stress concentrates at a line connecting the pair of notches 42 or at a line connecting the pair of notches 44. The reinforcement member 24 is therefore able to bend starting at the line connecting the pair of notches 42 or the line connecting the pair of notches 44, thus enabling bending of the RFID tag 10 at an unintended position over the IC chip 16 and the adhesive member 18 to be restricted.

Even in a case in which the reinforcement member 24 were bent at the central portion 24A, the central portion 24A of the reinforcement member 24 would be at a position offset along the length direction of the substrate 12 with respect to the IC chip 16 and the adhesive member 18. Accordingly, even if the reinforcement member 24 bends at the central portion 24A, flexural stress can be suppressed from acting on the IC chip 16 and stress can be suppressed from concentrating at the edges of the adhesive member 18. This enables the occurrence of cracks in the IC chip 16 to be suppressed and enables breaks in the antenna pattern 14 at the edges of the adhesive member 18 to be suppressed.

Note that in the tenth modified example illustrated in FIG. 17, two pairs of notches 42, 44 are formed in the reinforcement member 24. However, configuration may be such that only one pair of notches out of the two pairs of notches 42, 44 is formed in the reinforcement member 24. Configuration may also be such that the pairs of notches 42, 44 described above are formed in each of the first reinforcement member 24-1 and the second reinforcement member 24-2 of the first modified example of FIG. 8.

Eleventh Modified Example

Figure 18:
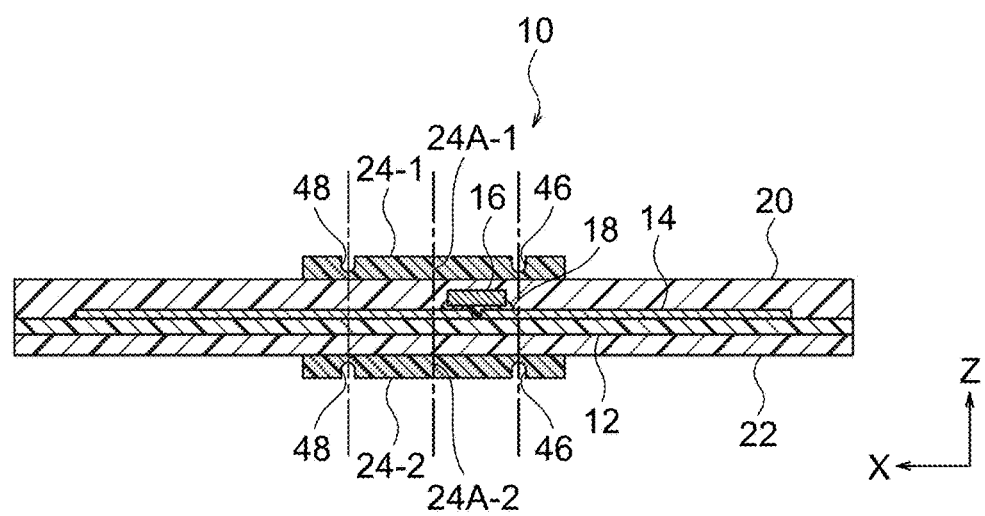
FIG. 18 is a vertical cross-section illustrating an eleventh modified example of an RFID tag according to the exemplary embodiment.

In an eleventh modified example illustrated in FIG. 18, in contrast to the first modified example above, the first reinforcement member 24-1 and the second reinforcement member 24-2 include a pair of grooves 46 and a pair of grooves 48. Both pairs of the grooves 46, 48 are open at both width direction sides of the substrate 12. The one pair of grooves 46 are at the same position as each other along the length direction of the substrate 12, and the other pair of grooves 48 are at the same position as each other along the length direction of the substrate 12. Each of the one pair of grooves 46 is formed at a position offset toward one length direction side of the substrate 12 with respect to the IC chip 16 and the adhesive member 18. In contrast thereto, each of the other pair of grooves 48 is formed at a position offset toward the other length direction side of the substrate 12 with respect to the IC chip 16 and the adhesive member 18.

With such a configuration, in cases in which compressive stress along the length direction acts on the RFID tag 10 or flexural stress acts on both length direction end portions of the RFID tag 10, stress concentrates at one of the grooves 46, 48. The first reinforcement member 24-1 and the second reinforcement member 24-2 are therefore able to bend starting at one of the grooves 46, 48, thus enabling bending of the RFID tag 10 at an unintended position over the IC chip 16 and the adhesive member 18 to be restricted.

Even in a case in which the reinforcement member 24 were bent at the central portion 24A, the central portion 24A of the reinforcement member 24 would be at a position offset along the length direction of the substrate 12 with respect to the IC chip 16 and the adhesive member 18. Accordingly, even if the reinforcement member 24 bends at the central portion 24A, flexural stress can be suppressed from acting on the IC chip 16 and stress can be suppressed from concentrating at the edges of the adhesive member 18. This enables the occurrence of cracks in the IC chip 16 to be suppressed and enables breaks in the antenna pattern 14 at the edges of the adhesive member 18 to be suppressed.

Note that in the eleventh modified example illustrated in FIG. 18, two pairs of grooves 46, 48 are formed in the first reinforcement member 24-1 and the second reinforcement member 24-2. However, configuration may be such that only one pair of grooves out of the two pairs of grooves 46, 48 is formed in the first reinforcement member 24-1 and the second reinforcement member 24-2. Configuration may also be such that at least one of the grooves 46, 48 described above is formed in a reinforcement member 24 disposed on only the front side of the substrate 12, as in the above exemplary embodiment illustrated in FIG. 1.

Twelfth Modified Example

Figure 19:
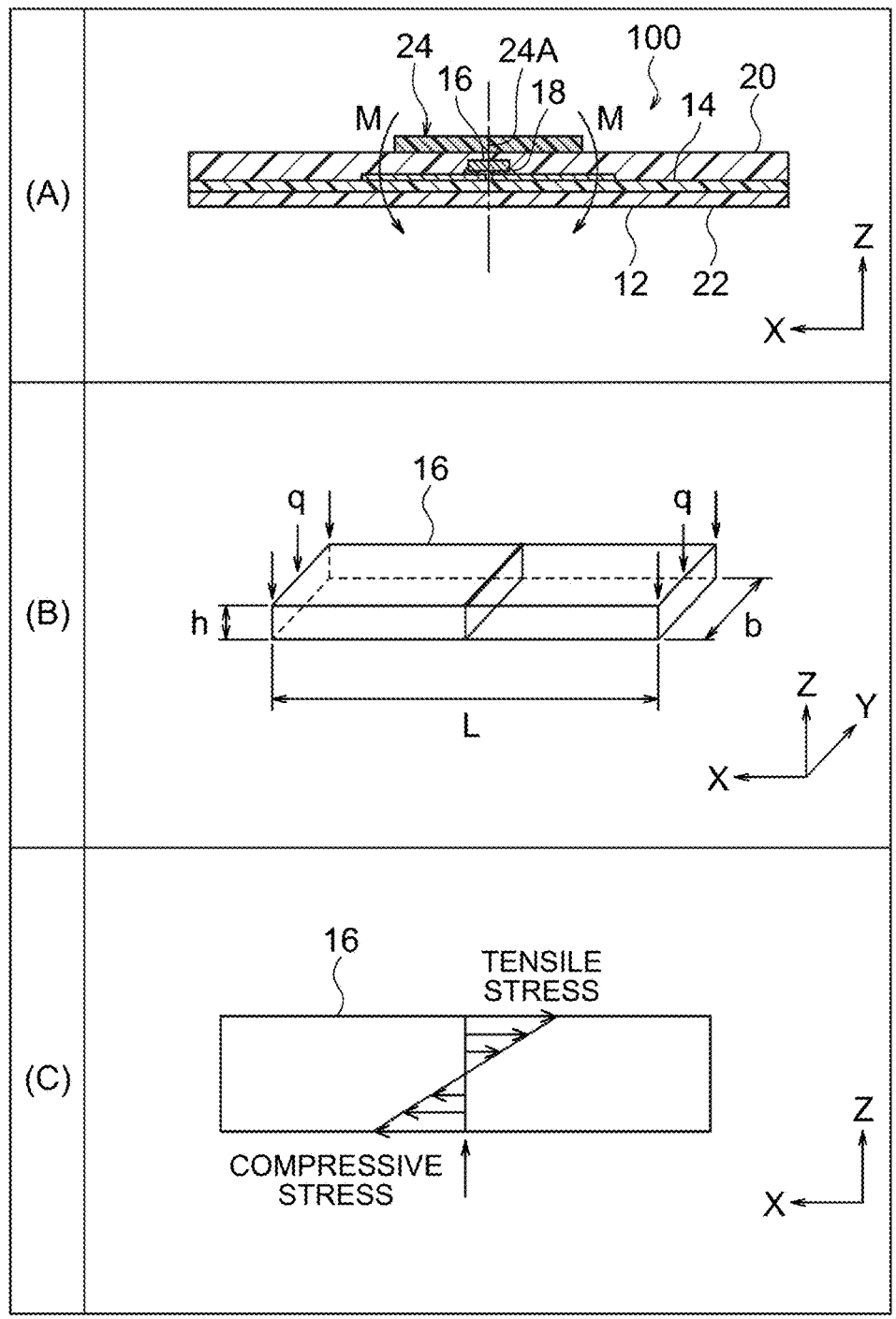
FIG. 19 is a diagram for explaining a case in which downward flexural load acts on an RFID tag according to a comparative example in relation to a twelfth modified example of an RFID tag according to the exemplary embodiment.

In a twelfth modified example, first, an investigation was performed with regards to the mounting direction of the IC chip 16. (A) in FIG. 19 illustrates an RFID tag 100 according to a comparative example in vertical cross-section. In the RFID tag 100, the central portion 24A of the reinforcement member 24 is positioned over the IC chip 16 and the adhesive member 18. In (A) of FIG. 19, flexural load is acting on the RFID tag 100 such that the reinforcement member 24 flexes so as to be convex upward.

In the RFID tag 100, in cases in which the reinforcement member 24 is flexed so as to be convex upward, a bending moment M acts on both ends of the IC chip 16. Bending moment M is at a maximum at a central portion of the IC chip 16, and the maximum value Mmax of bending moment M is expressed by Equation (6). Note that q is the force per unit length that is received by the IC chip 16 as a result of deformation of the reinforcement member 24. The width, length, and thickness of the IC chip 16 are respectively given as b, L, and h.

(B) in FIG. 19 schematically illustrates the IC chip 16 in perspective view. As illustrated by the bolded line on the IC chip 16 in (B) of FIG. 19, flexural stress σ acting on the IC chip 16 is at a maximum at a front surface of the central portion of the IC chip 16, and the maximum value σmax of the flexural stress is expressed by Equation (8) using Equation (7). Note that Z in Equations (7) and (8) is a section modulus.

$$M\mathrm{max}=q \times b \times L/2 \qquad (6)$$

$$Z=b \times h^2/6 \qquad (7)$$

$$\sigma\mathrm{max}=M\mathrm{max}/Z=3 \times q \times L/h^2 \qquad (8)$$

(C) in FIG. 19 illustrates cross-sectional stress states in the IC chip 16 reflecting Equation (8). It is apparent from (C) in FIG. 19 that stress increases and the IC chip 16 is more liable to crack as L increases (the longer the IC chip 16 is in the longitudinal direction). It can therefore be said to be preferable to mount the IC chip 16 with its length along the width direction of the substrate 12.

Figure 20:
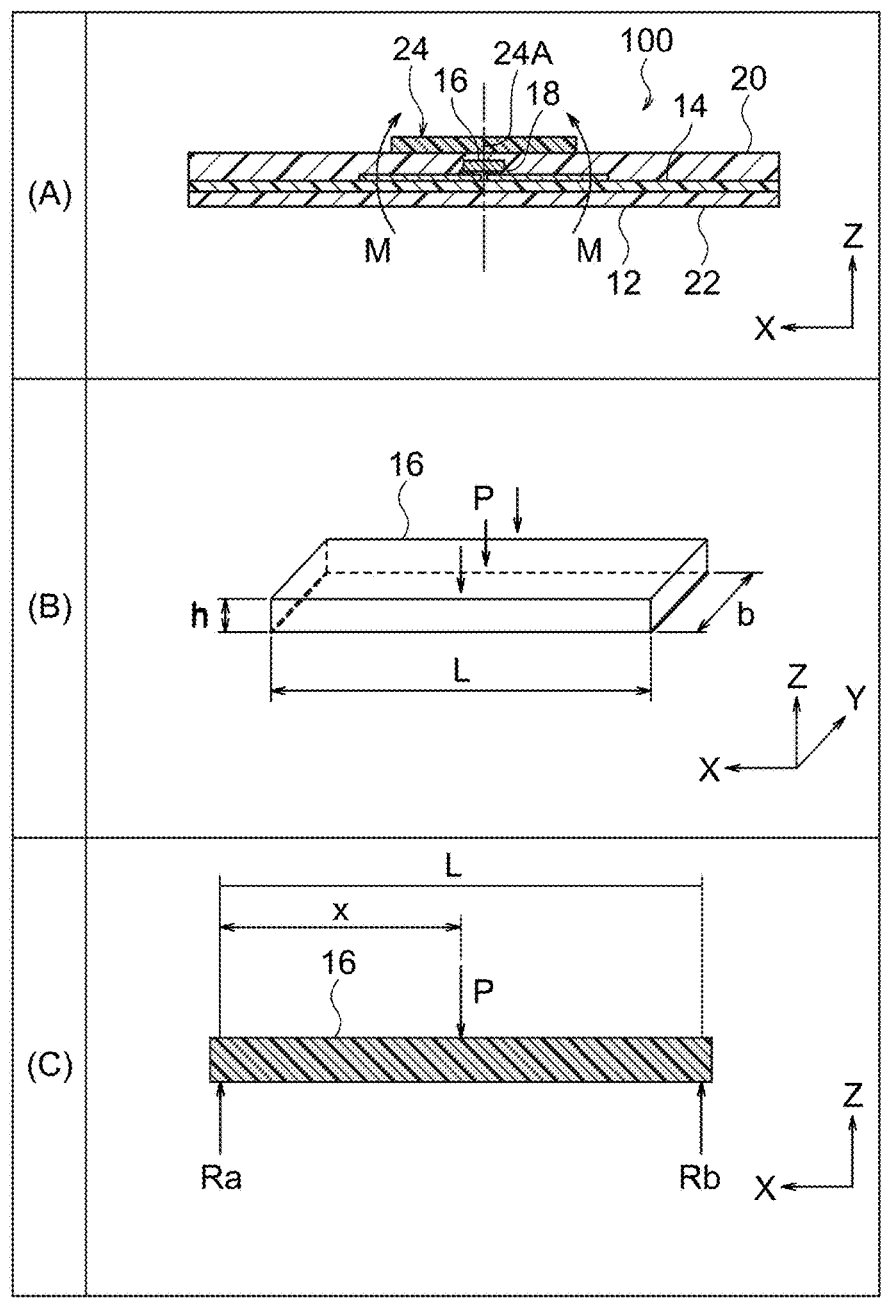
FIG. 20 is a diagram for explaining a case in which upward flexural load acts on an RFID tag according to a comparative example, in relation to a twelfth modified example of an RFID tag according to the exemplary embodiment.

In (A) of FIG. 20, flexural load is acting on the RFID tag 100 such that the reinforcement member 24 flexes so as to be convex downward. In the RFID tag 100, in cases in which the reinforcement member 24 is flexed so as to be convex downward, a bending moment M acts on both ends of the IC chip 16. (B) in FIG. 20 schematically illustrates the IC chip 16 in perspective view, and (C) in FIG. 20 illustrates a state in which load acting on the IC chip 16 is in equilibrium. P is a downward load acting on the longitudinal direction central portion of the IC chip 16. Ra and Rb are upward loads acting on both longitudinal direction end portions of the IC chip 16.

By balancing the loads, the load P can be expressed using Equation (9). Equation (10) can be derived by balancing the rotational moments. L is the length from an input point for the load Ra to an input point for the load Rb, and x is the length from the input point of the load Ra to an input point for the load P. Bending moment M, when x=x, is expressed by Equation (11). Equation (12) can be derived by differentiating M with respect to L.

$$P=Ra+Rb \qquad (9)$$

$$x \times P - L \times R \times b = 0 \qquad (10)$$

$$M=\{x \times (L-x) \times P\}/L \qquad (11)$$

$$dM/dL=P \times \{(x/L)^2+1\} \qquad (12)$$

In Equation (12), dM/dL monotonically increases regardless of the values of x and L. The bending moment M can therefore be said to increase as L increases. In other words, bending moment M decreases as L decreases, and flexural stress decreases as L decreases. It can therefore be said to be preferable to mount the IC chip 16 with its length along the width direction of the substrate 12.

Figure 21:
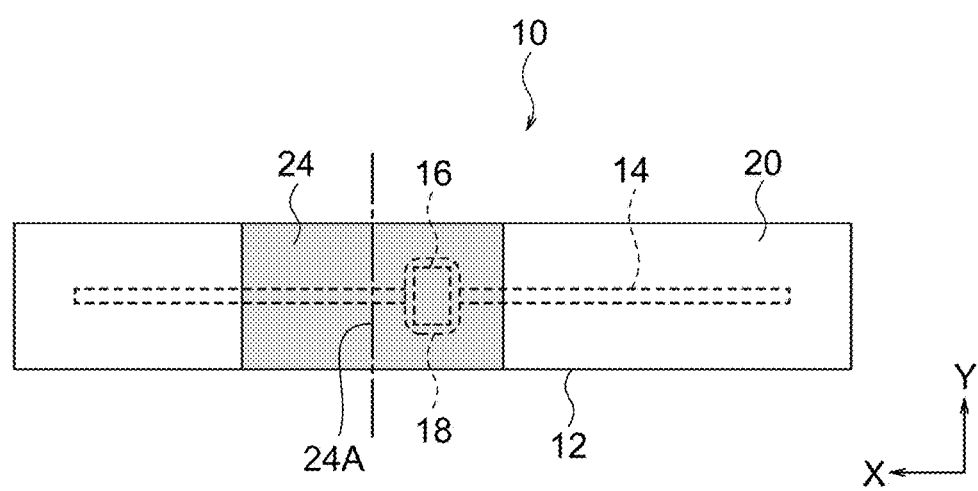
FIG. 21 is a plan view illustrating a twelfth modified example of an RFID tag according to the exemplary embodiment.

In the twelfth modified example of FIG. 21, as a result of the above investigation into the mounting direction of the IC chip 16, in contrast to the above exemplary embodiment, the IC chip 16 is disposed with its longitudinal direction along the width direction of the substrate 12.

With such a configuration, the longitudinal direction of the IC chip 16, this being the direction along which the IC chip 16 is liable to flex, is orthogonal to the length direction of the RFID tag 10. Thus, even in cases in which compressive stress along the length direction acts on the RFID tag 10 or flexural stress acts on both length direction end portions of the RFID tag 10, bending of the IC chip 16 can be suppressed.

Thirteenth Modified Example

Figure 22:
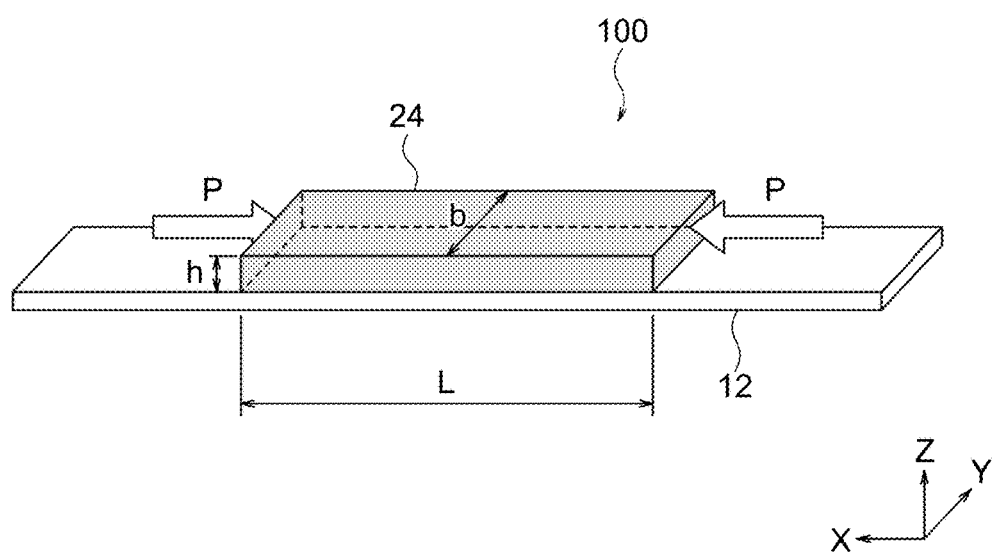
FIG. 22 is a diagram for explaining a case in which compressive load acts on a reinforcement member of an RFID tag according to a comparative example, in relation to a thirteenth modified example of an RFID tag according to the exemplary embodiment.

In a thirteenth modified example, first, an investigation was performed with regards to a dimension in which buckling does not occur in the reinforcement member 24. FIG. 22 illustrates an RFID tag 100 according to a comparative example in perspective view. P is compressive load acting on both end portions of the first reinforcement member 24, and is expressed by Equation (13). σ is compressive stress acting along the longitudinal direction of the reinforcement member 24 along. In the following, for the reinforcement member 24, λ is the linear extension ratio, L is the length, h is the thickness, b is the width, E is the Young's modulus, and I is the second moment of area of the cross-section.

When the linear extension ratio λ is given by Equation (14), Equation (15) can be derived for compressive load P using an Euler equation. In cases in which L satisfies Equation (16), buckling does not occur in the reinforcement member 24.

$$P = \sigma \times b \times h \tag{13}$$

$$\lambda = L/(h/2\sqrt{3}) \geq 100 \tag{14}$$

$$P \leq \frac{\pi^2 EI}{L^2} = \frac{\pi^2 E}{L^2} \times \frac{bh^3}{12} \tag{15}$$

$$L \leq \frac{\pi h}{2\sqrt{3}} \sqrt{\frac{E}{\sigma}} \tag{16}$$

Figure 23:
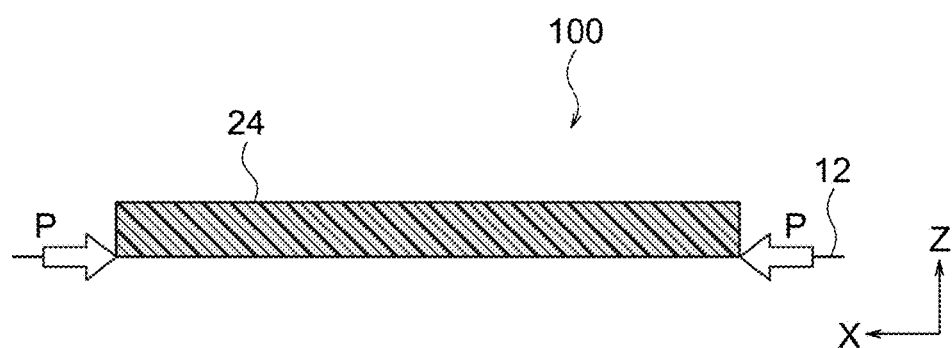
FIG. 23 is a diagram for explaining a case in which eccentric compressive load acts on a reinforcement member of an RFID tag according to a comparative example, in relation to a thirteenth modified example of an RFID tag according to the exemplary embodiment.

Next, an investigation was performed with regards to dimensions for which compression failure does not occur in the reinforcement member 24. FIG. 23 illustrates relevant portion of an RFID tag 100 according to a comparative example in vertical cross-section. P is eccentric compressive load acting on the back surface side of both longitudinal direction end portions of the reinforcement member 24, and is expressed by Equation (13) described above. Tensile stress is at a maximum at a front surface central portion of the reinforcement member 24, and the maximum value σr of the tensile stress is expressed by Equation (17). The compressive stress is at a maximum at a back surface central portion of the reinforcement member 24, and the maximum value σr of the compressive stress is expressed by Equation (18).

In the following, the linear extension ratio, length, and thickness of the reinforcement member 24 are respectively given as λ, L, and h. In addition, for the reinforcement member 24, M is the bending moment acting on the reinforcement member 24, Z is the section modulus, 4σ is the compressive stress acting on the back surface central portion of the reinforcement member 24, 2σ is the tensile stress acting on the front surface central portion of the reinforcement member 24, $\sigma_c$ is the compressive strength, and $\sigma_b$ is the tensile strength.

When the linear extension ratio λ is given by Equation (19), in cases in which Equation (20) is satisfied at the front surface central portion of the reinforcement member 24, where stress is at a maximum, namely, in cases in which Equation (21) and Equation (22) are satisfied, the reinforcement member 24 does not bow due to flexural stress even when acted upon by eccentric compressive load. Namely, when the linear extension ratio λ is given by Equation (19), in cases in which Equation (21) and Equation (22) are satisfied, compression failure does not occur in the reinforcement member 24.

$$\sigma r = -2\sigma \tag{17}$$

$$\sigma r = 4\sigma \tag{18}$$

$$\lambda = L/(h/2\sqrt{3}) \leq 100 \tag{19}$$

$$\sigma r = \sigma \pm M/Z = \sigma \pm 3\sigma \tag{20}$$

$$4\sigma < \sigma_c \tag{21}$$

$$2\sigma < \sigma b \tag{22}$$

In the thirteenth modified example, as a result of the above investigation into dimensions for which buckling does not occur in the reinforcement member 24 and investigation into dimensions for which the reinforcement member 24 does not undergo compression failure, in contrast to the exemplary embodiment above illustrated in FIG. 1, a length L and thickness h for the reinforcement member 24 that satisfy Equation (15) and Equation (16) are applied. Alternatively, in the thirteenth modified example, in contrast to the above exemplary embodiment illustrated in FIG. 1, a length L and thickness h for the reinforcement member 24 that satisfy Equation (19), Equation (21), and Equation (22) can be applied.

Buckling of the reinforcement member 24 can be avoided when a length L and thickness h for the reinforcement member 24 that satisfy Equation (15) and Equation (16) are applied. Compression failure of the reinforcement member 24 can be avoided when a length L and thickness h for the reinforcement member 24 that satisfy Equation (19), Equation (21), and Equation (22) are applied.

Even in a case in which the reinforcement member 24 were bent at the central portion 24A, the central portion 24A of the reinforcement member 24 would be at a position offset along the length direction of the substrate 12 with respect to the IC chip 16 and the adhesive member 18. Accordingly, even if the reinforcement member 24 bends at the central portion 24A, flexural stress can be suppressed from acting on the IC chip 16 and stress can be suppressed from concentrating at the edges of the adhesive member 18. This enables the occurrence of cracks in the IC chip 16 to be suppressed and breaks in the antenna pattern 14 at the edges of the adhesive member 18 to be suppressed.

Fourteenth Modified Example

Figure 24:
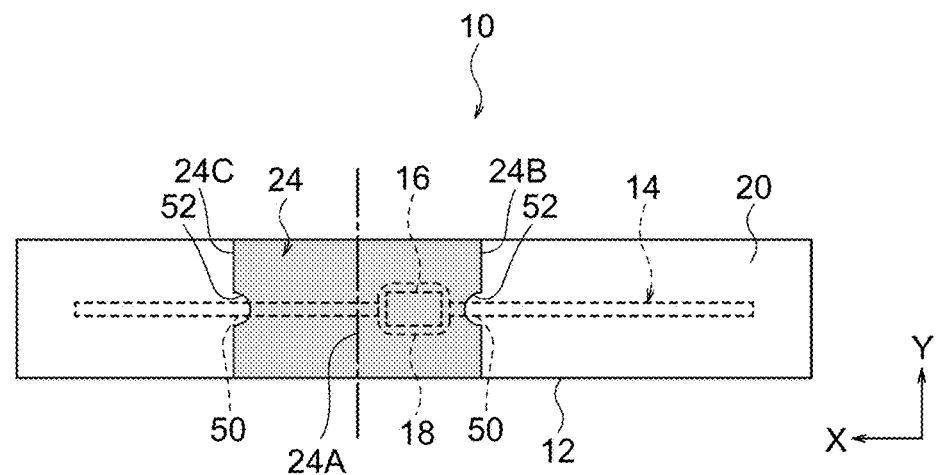
FIG. 24 is a plan view illustrating a fourteenth modified example of an RFID tag according to the exemplary embodiment.

In a fourteenth modified example illustrated in FIG. 24, in contrast to the above exemplary embodiment, the antenna pattern 14 includes lead-out portions 50 that lead out from both longitudinal direction side end portions 24B, 24C of the reinforcement member 24. Notch-shaped escape portions 52 are formed in the end portions 24B, 24C, described above, of the reinforcement member 24 at positions overlapping the lead-out portions 50 in plan view of the reinforcement member 24.

With such a configuration, even in cases in which the RFID tag 10 undergoes flexural deformation starting at the end portions 24B, 24C of the reinforcement member 24, interference between the reinforcement member 24 and the antenna pattern 14 (the lead-out portions 50) can be suppressed. This enables breaks in the antenna pattern 14 to be suppressed.

Fifteenth Modified Example

Figure 25:
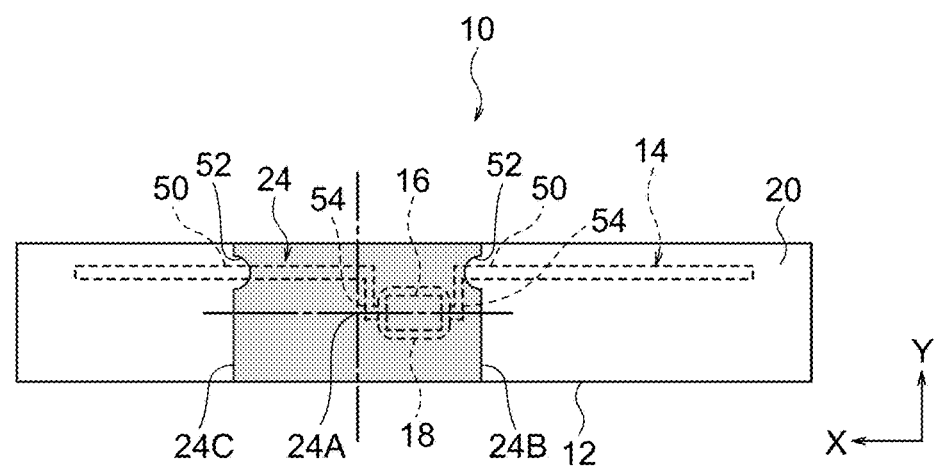
FIG. 25 is a plan view illustrating a fifteenth modified example of an RFID tag according to the exemplary embodiment.

In a fifteenth modified example illustrated in FIG. 25, in contrast to the fourteenth modified example above, portions 54 of the antenna pattern 14 between the lead-out portions 50 and the IC chip 16 extend along the width direction of the substrate 12. The lead-out portions 50 are linked to the portions 54 of the antenna pattern 14 between the lead-out portions 50 and the IC chip 16. The lead-out portions 50 are disposed at positions offset along the width direction of the substrate 12 with respect to the central portion 24A (transverse direction central portion) of the reinforcement member 24. The notch-shaped escape portions 52 are also formed at positions offset along the width direction of the substrate 12 with respect to the central portion 24A of the reinforcement member 24 so as to correspond to the lead-out portions 50.

With such a configuration, even in cases in which the RFID tag 10 undergoes flexural deformation starting at the end portions 24B, 24C of the reinforcement member 24, interference between the reinforcement member 24 and the antenna pattern 14 (the lead-out portions 50) can be suppressed. This enables breaks in the antenna pattern 14 to be suppressed.

Since each of the lead-out portions 50 is disposed at a position offset along the width direction of the substrate 12 with respect to the central portion 24A of the reinforcement member 24, even if the reinforcement member 24 bends at the central portion 24A (transverse direction central portion), twists, creases, or the like can be suppressed from occurring in the lead-out portions 50. This also enables breaks in the antenna pattern 14 to be suppressed.

Sixteenth Modified Example

Figure 26:
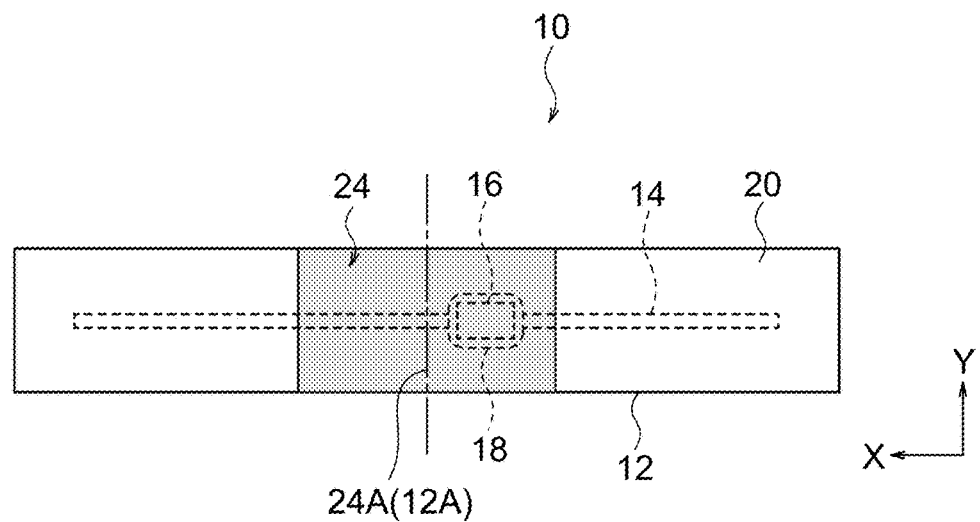
FIG. 26 is a plan view illustrating a sixteenth modified example of an RFID tag according to the exemplary embodiment.

In a sixteenth modified example illustrated in FIG. 26, a central portion 12A of the substrate 12 and the central portion 24A of the reinforcement member 24 are at the same position as each other along the length direction of the substrate 12. The central portion 12A of the substrate 12 and the central portion 24A of the reinforcement member 24 are at positions offset along the length direction of the substrate 12 with respect to the IC chip 16 and the adhesive member 18.

With such a configuration, in cases in which compressive stress acts on the RFID tag 10 along the length direction or flexural stress acts on both length direction end portions of the RFID tag 10, the substrate 12 and the reinforcement member 24 bow at the same position offset with respect to the IC chip 16 and the adhesive member 18. This enables the occurrence of cracks in the IC chip 16 to be suppressed and breaks in the antenna pattern 14 at the edges of the adhesive member 18 to be more effectively suppressed.

Other Modified Examples

Figure 27:
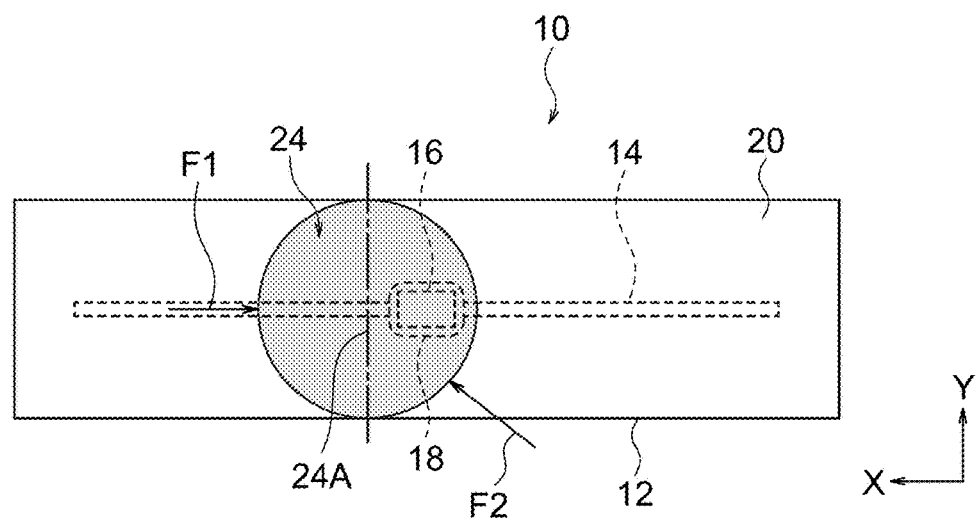
FIG. 27 is a plan view illustrating a seventeenth modified example of an RFID tag according to the exemplary embodiment.

In the above exemplary embodiment, although the reinforcement member 24 has a rectangular shape in plan view, as illustrated in FIG. 27, the reinforcement member 24 may have a circular shape in plan view. Thus, when the reinforcement member 24 has a circular shape in plan view, for example, even if a force F1 along the length direction of the substrate 12 and a force F2 along a direction at an angle with respect to both the length direction and the width direction of the substrate 12 act on the reinforcement member 24, the forces are dispersed over the reinforcement member 24. This enables bending of the reinforcement member 24 to be suppressed.

The reinforcement member 24 may also have a shape other than a rectangular shape or circular shape in plan view. For example, the reinforcement member 24 may have a square shape, an elliptical shape, a polygonal shape, or the like.

Figure 28:
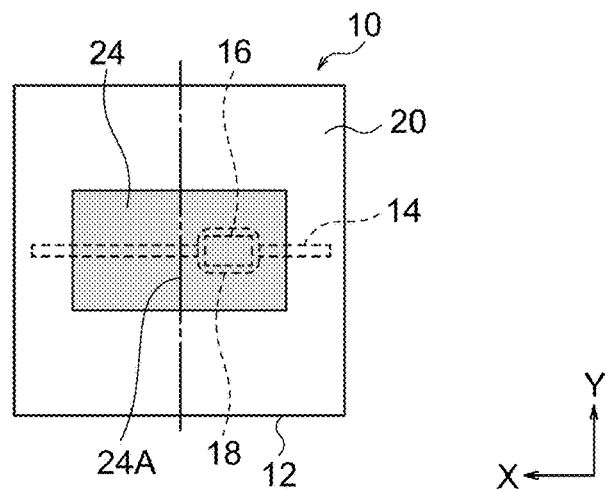
FIG. 28 is a plan view illustrating an eighteenth modified example of an RFID tag according to the exemplary embodiment.

In the above exemplary embodiment, although the substrate 12 has a rectangular shape in plan view, as illustrated in FIG. 28, the substrate 12 may have a square shape in plan view. In cases in which the substrate 12 has a square shape in plan view, the length direction of the substrate 12 corresponds to the length direction of one side out of the four sides of the square shape.

Figure 29:
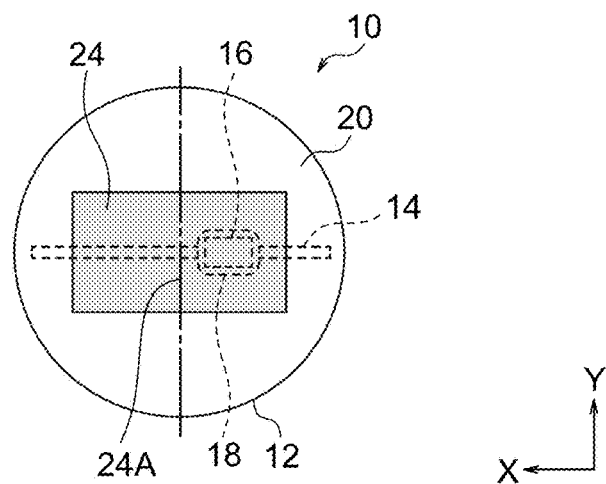
FIG. 29 is a plan view illustrating a nineteenth modified example of an RFID tag according to the exemplary embodiment.

As illustrated in FIG. 29, the substrate 12 may also have a circular shape in plan view. In cases in which the substrate 12 has a circular shape in plan view, the length direction of the substrate 12 corresponds to a radial direction of the circular shape.

Figure 30:
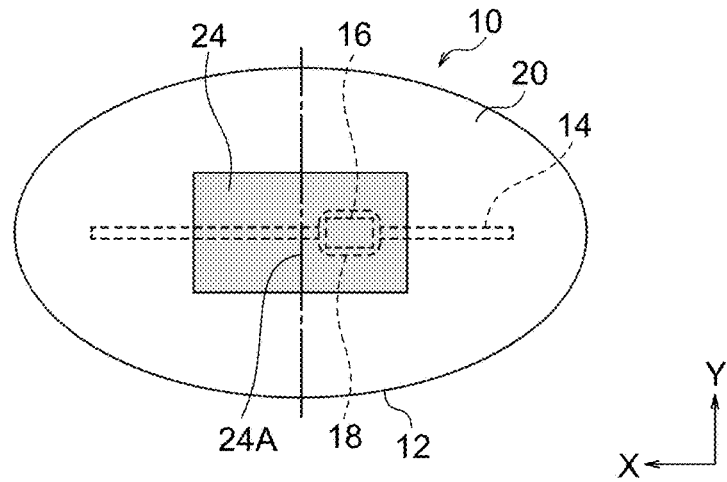
FIG. 30 is a plan view illustrating a twentieth modified example of an RFID tag according to the exemplary embodiment.

As illustrated in FIG. 30, the substrate 12 may also have an elliptical shape in plan view. In cases in which the substrate 12 has an elliptical shape in plan view, the length direction of the substrate 12 corresponds to the longitudinal direction of the elliptical shape. The substrate 12 may also have a shape other than those given above in plan view.

In the above exemplary embodiment, as illustrated in FIG. 1, although the substrate 12 includes the first protective layer 20 and the second protective layer 22, the first protective layer 20 and the second protective layer 22 may be omitted from the substrate 12.

In the above exemplary embodiment, as illustrated in FIG. 1, the reinforcement member 24 is overlaid onto the front surface of the first protective layer 20 (a laminate layer). However, as illustrated in FIG. 31, the reinforcement member 24 may be overlaid onto the back surface of the substrate 12 and disposed at the inner side of the second protective layer 22 (a laminate layer).

Figure 31:
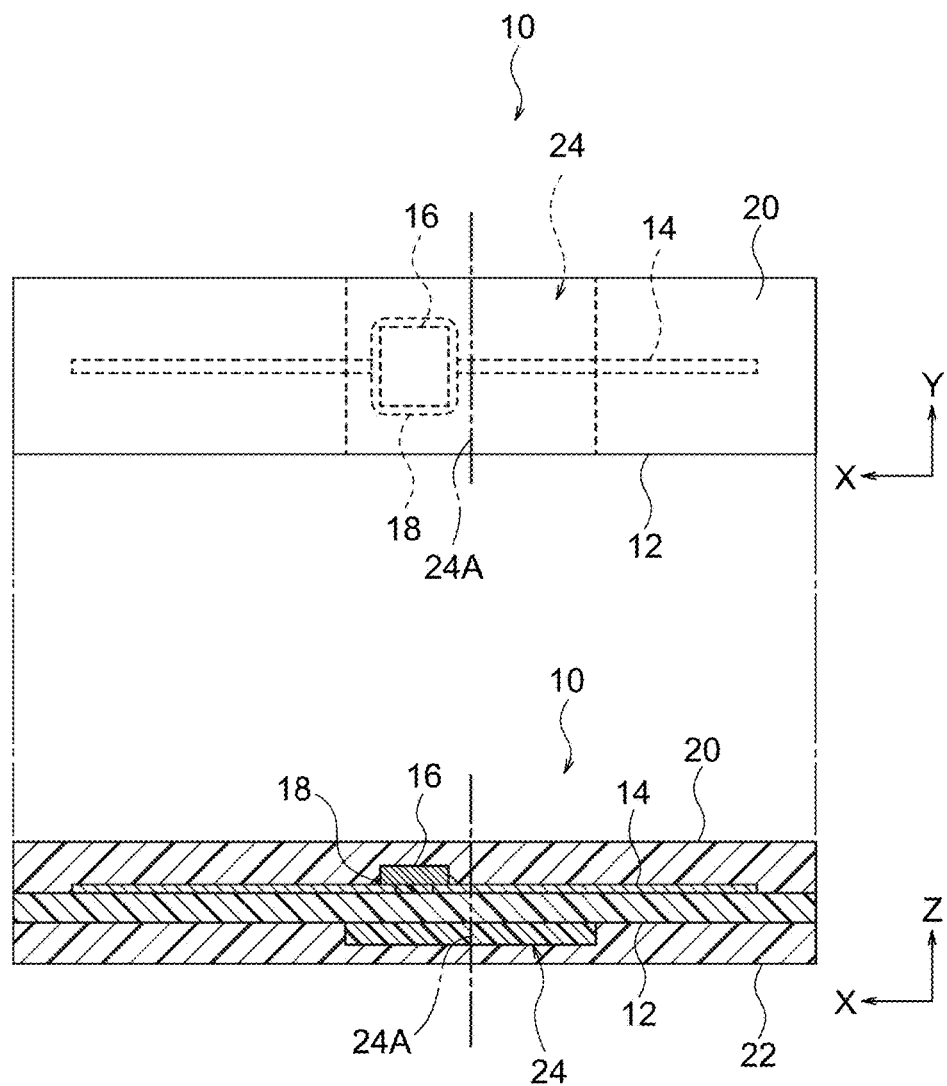
FIG. 31 is a drawing in two planes illustrating a twenty-first modified example of an RFID tag according to the exemplary embodiment.
Figure 32:
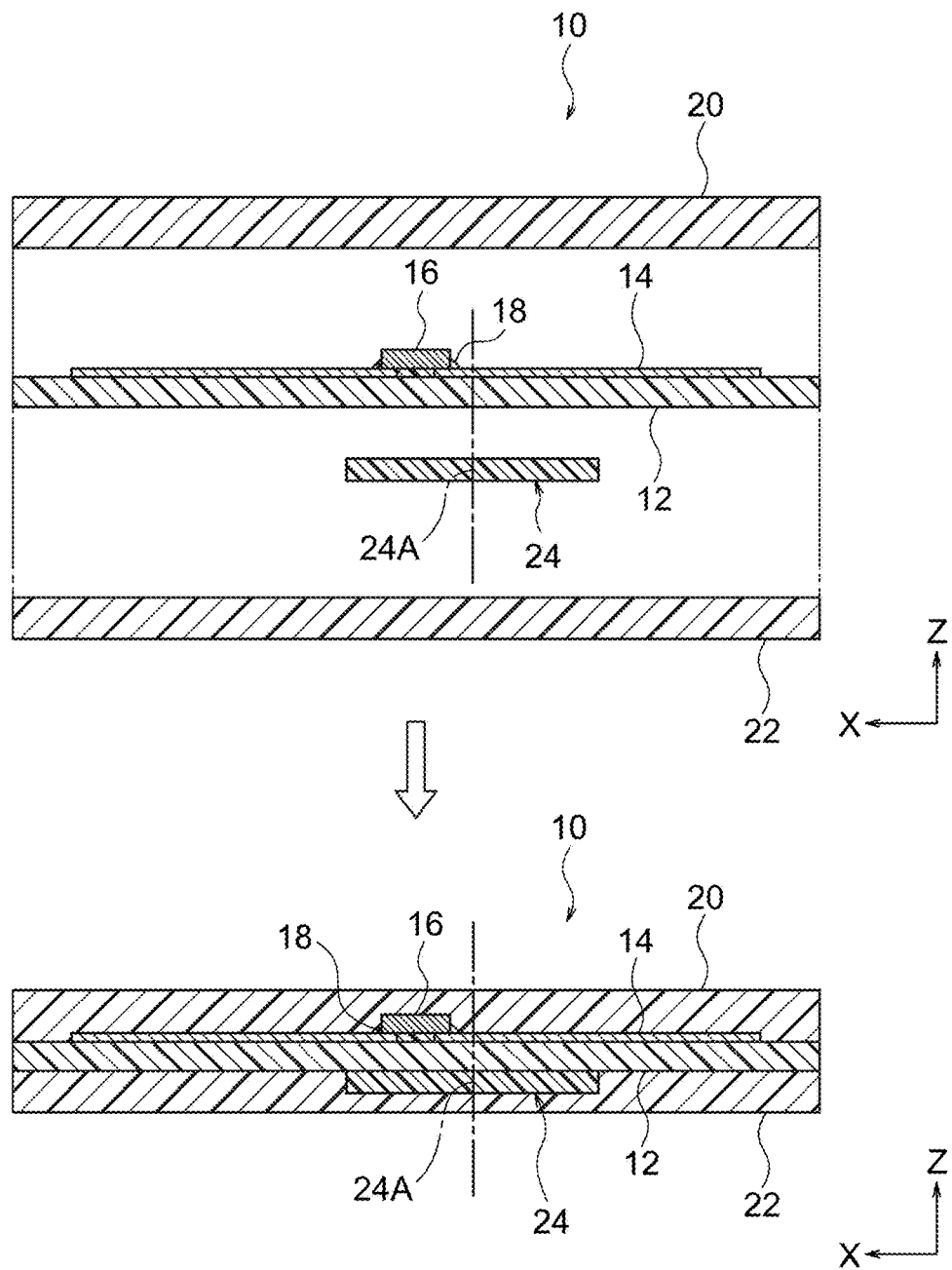
FIG. 32 is a diagram for explaining a lamination process in a twenty-first modified example of an RFID tag according to the exemplary embodiment.

As illustrated in FIG. 31, even in cases in which the reinforcement member 24 is overlaid onto the back surface of the substrate 12 and disposed at the inner side of the second protective layer 22, as illustrated in FIG. 32, it is, for example, still possible to manufacture the RFID tag 10 using a lamination process.

Thus, since the reinforcement member 24 is covered by the second protective layer 22 when the reinforcement member 24 is disposed at the inner side of the second protective layer 22 (between the substrate 12 and the second protective layer 22), the reinforcement member 24 can be suppressed from peeling off.

Figure 33:
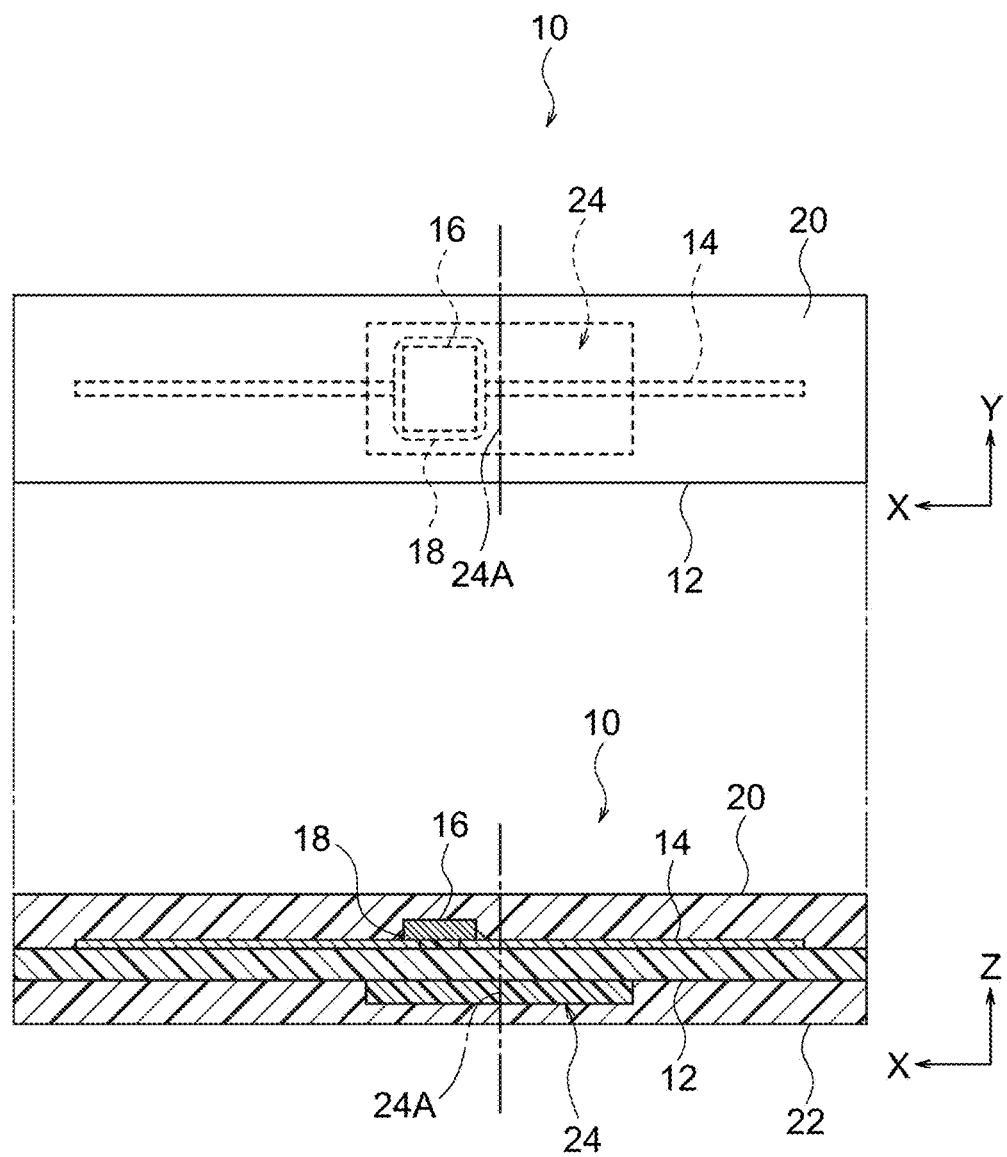
FIG. 33 is a drawing in two planes illustrating a twenty-second modified example of an RFID tag according to the exemplary embodiment.

As illustrated in FIG. 33, by making the dimensions of the reinforcement member 24 smaller than the dimensions of the substrate 12 along the width direction of the substrate 12, the four sides of a quadrilateral-shaped reinforcement member 24 may all be contained within the second protective layer 22 in plan view.

Thus, since the entirety of the reinforcement member 24 is covered by the second protective layer 22 when all four sides of the reinforcement member 24 are contained within the second protective layer 22, the reinforcement member 24 can be even more effectively suppressed from peeling off.

Figure 34:
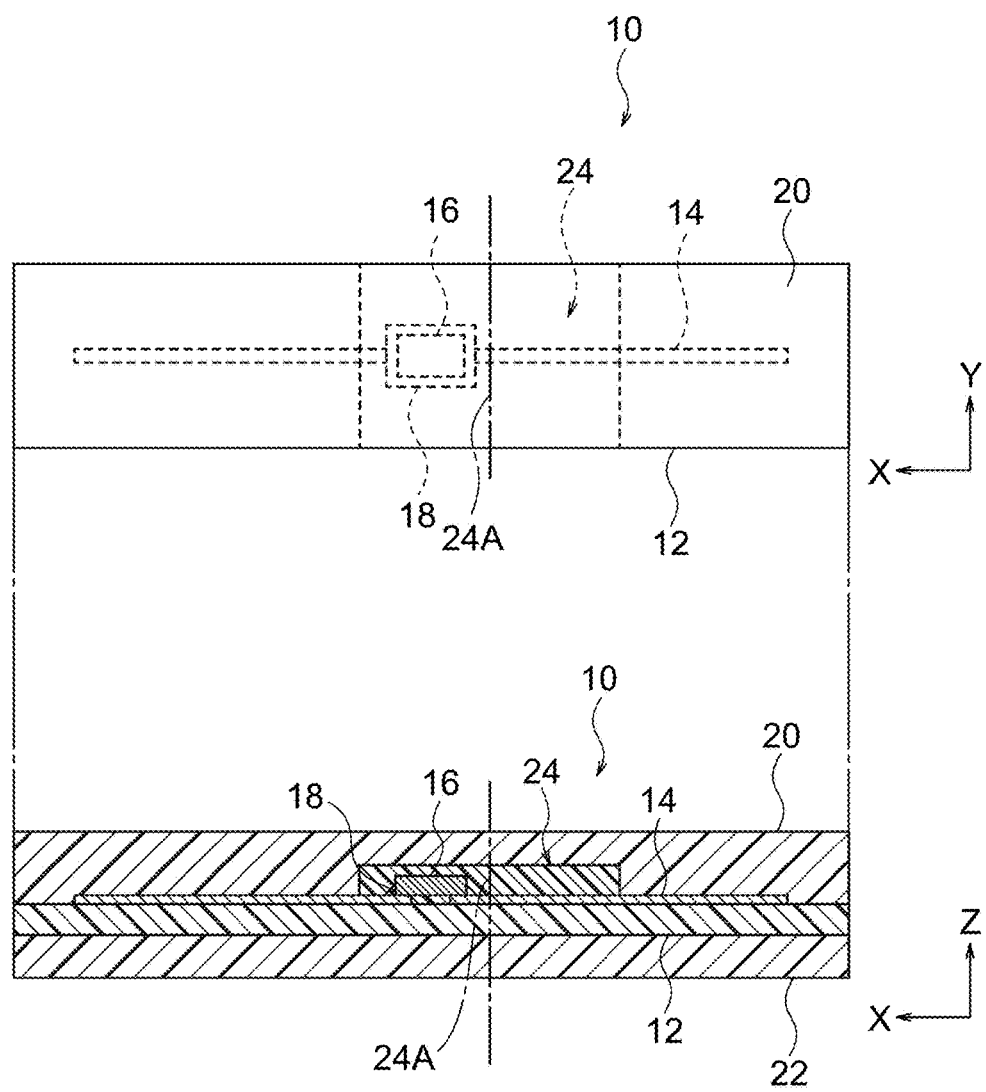
FIG. 34 is a drawing in two planes illustrating a twenty-third modified example of an RFID tag according to the exemplary embodiment.

In the modified example illustrated in FIG. 31, the reinforcement member 24 is overlaid onto the back surface of the substrate 12 and disposed at the inner side of the second protective layer 22. However, as illustrated in FIG. 34, the reinforcement member 24 may be overlaid onto the front surface of the substrate 12 and disposed at the inner side of the first protective layer 20.

Figure 35:
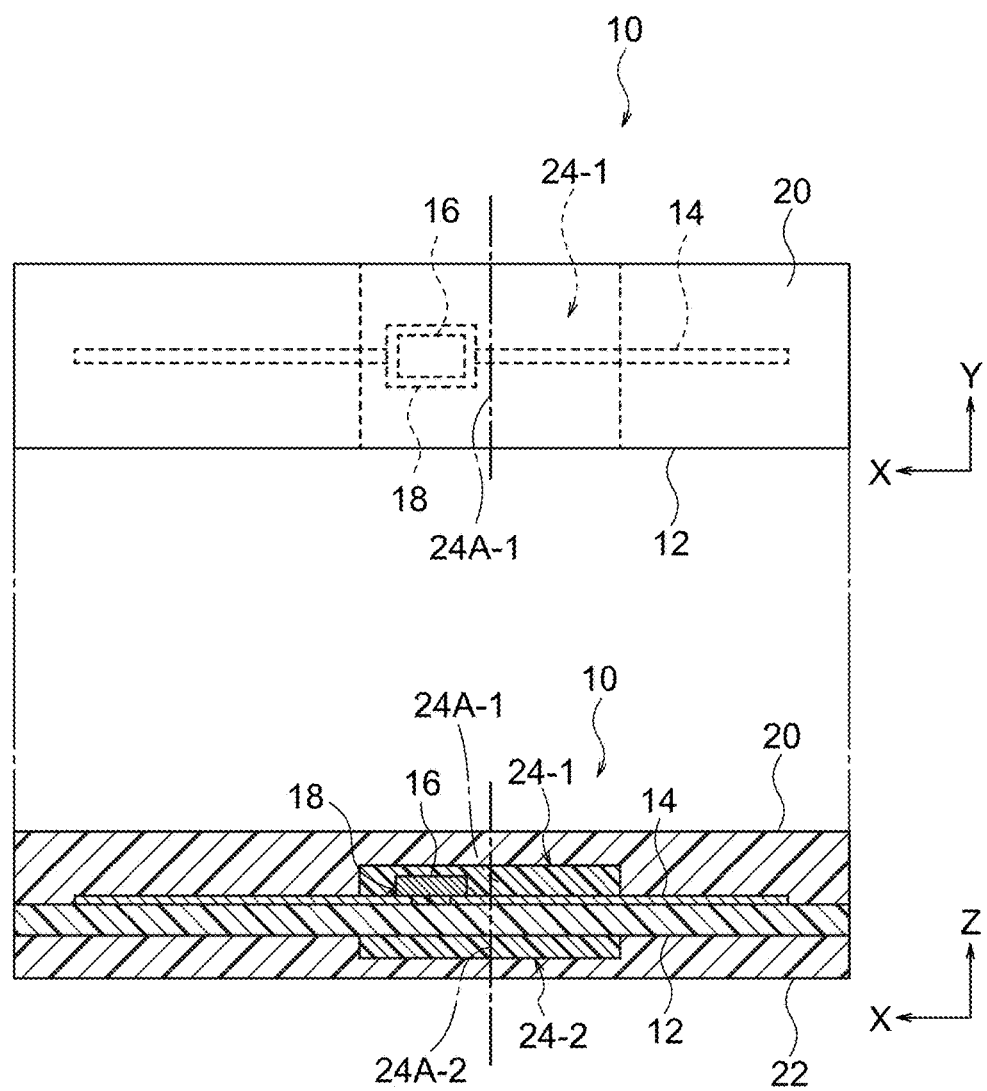
FIG. 35 is a drawing in two planes illustrating a twenty-fourth modified example of an RFID tag according to the exemplary embodiment.

As illustrated in FIG. 35, the first reinforcement member 24-1 may be overlaid onto the front surface of the substrate 12 and the second reinforcement member 24-2 may be overlaid onto the back surface of the substrate 12. In addition, the first reinforcement member 24-1 may be disposed at the inner side of the first protective layer 20, and the second reinforcement member 24-2 may also be disposed at the inner side of the second protective layer 22.

Note that out of the plural modified example described above, modified examples that can be combined may be combined as appropriate.

Explanation has been given regarding an exemplary embodiment of technology disclosed herein. However, the technology disclosed herein is not limited to the above, and obviously various other modifications to the above may be implemented within a range not departing from the spirit of the technology disclosed herein.

All cited documents, patent applications, and technical standards mentioned in the present specification are incorporated by reference in the present specification to the same extent as if each individual cited document, patent application, or technical standard was specifically and individually indicated to be incorporated by reference.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

Explanation follows regarding instructive examples.

In the tenth modified example illustrated in FIG. 17, the central portion 24A of the reinforcement member 24 is at a position offset along the length direction of the substrate 12 with respect to the IC chip 16 and the adhesive member 18. However, in an RFID tag according to an instructive example, in contrast to the tenth modified example, a central portion 24A of a reinforcement member 24 may be positioned over an IC chip 16 and an adhesive member 18. Namely, in a configuration in which the central portion 24A of the reinforcement member 24 is positioned over the IC chip 16 and the adhesive member 18, at least one pair of the notches 42, 44 may be formed in the reinforcement member 24, at positions offset along the length direction of the substrate 12 with respect to the IC chip 16 and the adhesive member 18.

Similarly, in a configuration in which the central portion 24A of the reinforcement member 24 is positioned over the IC chip 16 and the adhesive member 18, at least one of the grooves 46, 48 illustrated in FIG. 18 may be formed in the reinforcement member 24 at a position offset along the length direction of the substrate 12 with respect to the IC chip 16 and the adhesive member 18.

In a configuration in which the central portion 24A of the reinforcement member 24 is positioned over the IC chip 16 and the adhesive member 18, out of the modified examples described above, those which are applicable may be applied as appropriate.

What is claimed is:

1. An RFID tag comprising:
a flexible, sheet-shaped substrate;
an antenna pattern that is formed on the substrate;
an IC chip that is mounted on the substrate and that is connected to the antenna pattern;
an adhesive member that adheres the IC chip to the substrate; and
a reinforcement member that covers the IC chip and the adhesive, and that is at a position such that a central portion of the reinforcement member is offset along a length direction of the substrate with respect to the IC chip and the adhesive member.

2. The RFID tag of claim 1, wherein:
in the length direction of the substrate, the IC chip and the adhesive member are disposed between the central portion of the reinforcement member and one end portion of the reinforcement member.

3. The RFID tag of claim 1, wherein:
the reinforcement member includes a first reinforcement member disposed at a front side of the substrate and a second reinforcement member disposed at a back side of the substrate.

4. The RFID tag of claim 3, wherein:
a central portion of the first reinforcement member and a central portion of the second reinforcement member are positioned at the same position as each other along the length direction of the substrate with respect to the IC chip and the adhesive member.

5. The RFID tag of claim 4, wherein:
the central portion of the first reinforcement member and the central portion of the second reinforcement member are at the same position as each other along the length direction of the substrate.

6. The RFID tag of claim 4, wherein:
the positions of the central portion of the first reinforcement member and the central portion of the second reinforcement member are offset from each other along the length direction of the substrate.

7. The RFID tag of claim 4, wherein:
the positions of one end portion of the first reinforcement member and one end portion of the second reinforcement member are offset from each other along the length direction of the substrate.

8. The RFID tag of claim 1, wherein:
the reinforcement member is overlaid onto a surface of the substrate on an opposite side to the side where the IC chip is mounted.

9. The RFID tag of claim 1, wherein:
a connection portion on the antenna pattern to the IC chip extends along a width direction of the substrate; and
the reinforcement member covers the connection portion.

10. The RFID tag of claim 1, wherein:
the central portion of the reinforcement member is at a position offset along the length direction and a width direction of the substrate with respect to the IC chip and the adhesive member.

11. The RFID tag of claim 1, wherein:
the reinforcement member is disposed with its longitudinal direction along a width direction of the substrate.

12. The RFID tag of claim 1, wherein:
the reinforcement member includes a pair of notches that are open at both width direction sides of the substrate, and
the pair of notches are formed at positions offset along the length direction of the substrate with respect to the IC chip and the adhesive, and are at the same position as each other along the length direction of the substrate.

13. The RFID tag of claim 1, wherein:
the reinforcement member includes a groove that extends along a width direction of the substrate and that is formed at a position offset along the length direction of the substrate with respect to the IC chip and the adhesive.

14. The RFID tag of claim 1, wherein:
the IC chip is disposed with its longitudinal direction along a width direction of the substrate.

15. The RFID tag of claim 1, wherein Equation (1) and Equation (2) given below are satisfied, $$\lambda = L/\left(h/2\sqrt{3}\right) \geqq 100 \qquad (1)$$

-continued $$L \leq \frac{\pi h}{2\sqrt{3}} \sqrt{\frac{E}{\sigma}} \quad (2)$$

wherein, for the reinforcement member, λ is the linear extension ratio, L is the length, h is the thickness, E is the Young's modulus, and σ is the compressive stress acting on the reinforcement member along the length direction of the substrate.

16. The RFID tag of claim 1, wherein Equation (3), Equation (4), and Equation (5) given below are satisfied, $$\lambda = L/(h/2\sqrt{3}) \leq 100 \quad (3)$$

$$4\sigma < \sigma_c \quad (4)$$

$$2\sigma < \sigma_b \quad (5)$$

wherein, for the reinforcement member, λ is the linear extension ratio, L is the length, h is the thickness, 4σ is the compressive stress acting on a back surface central portion of the reinforcement member, 2σ is the tensile stress acting on a front surface central portion of the reinforcement member, $\sigma_c$ is the compressive strength, and $\sigma_b$ is the tensile strength.

17. The RFID tag of claim 1, wherein:
the antenna pattern includes a lead-out portion that leads out along the length direction of the substrate from an end portion of the reinforcement member; and
a notch-shaped escape portion is formed in the end portion of the reinforcement member at a position overlapping with the lead-out portion in a plan view of the reinforcement member.

18. The RFID tag of claim 1, wherein:
the lead-out portion is disposed at a position offset along a width direction of the substrate with respect to the central portion of the reinforcement member.

19. The RFID tag of claim 1, wherein:
a central portion of the substrate and the central portion of the reinforcement member are at the same position as each other along the length direction of the substrate.

20. The RFID tag of claim 1, wherein:
the reinforcement has one of a quadrilateral shape, a circular shape, a rectangular shape, a square shape, or an elliptical shape in plan view.

* * * * *